United States Patent
Kang et al.

(10) Patent No.: US 10,222,412 B2
(45) Date of Patent: Mar. 5, 2019

(54) IC DEGRADATION MANAGEMENT CIRCUIT, SYSTEM AND METHOD

(71) Applicant: Taiwan Semiconductor Manufacturing Co., Ltd., Hsin-Chu (TW)

(72) Inventors: Po-Zeng Kang, Hsin-Hua (TW); Chih-Hsien Chang, New Taipei (TW); Wen-Shen Chou, Zhubei (TW); Yung-Chow Peng, Hinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 276 days.

(21) Appl. No.: 15/170,707

(22) Filed: Jun. 1, 2016

(65) Prior Publication Data
US 2017/0350938 A1 Dec. 7, 2017

(51) Int. Cl.
*G06F 17/50* (2006.01)
*G01R 31/28* (2006.01)
*H03K 3/03* (2006.01)
*H03K 19/20* (2006.01)

(52) U.S. Cl.
CPC ..... *G01R 31/2874* (2013.01); *G01R 31/2855* (2013.01); *G01R 31/2858* (2013.01); *H03K 3/0315* (2013.01); *H03K 19/20* (2013.01)

(58) Field of Classification Search
CPC .... G01R 31/26; G01R 31/28; G01R 31/2851; G01R 31/2874; G01R 31/2896
USPC ......................................................... 716/136
See application file for complete search history.

(56) References Cited

U.S. PATENT DOCUMENTS

| | | | |
|---|---|---|---|
| 8,448,100 B1 | 5/2013 | Lin et al. | |
| 8,631,372 B2 | 1/2014 | Yu et al. | |
| 8,669,780 B2 | 3/2014 | Chi | |
| 8,701,073 B1 | 4/2014 | Fu et al. | |
| 8,754,818 B2 | 6/2014 | Yen et al. | |
| 8,896,094 B2 | 11/2014 | Yen et al. | |
| 9,016,939 B2 | 4/2015 | Chang et al. | |
| 9,086,452 B2 | 7/2015 | Wang et al. | |
| 9,165,968 B2 | 10/2015 | Chao et al. | |
| 9,171,798 B2 | 10/2015 | Lin et al. | |
| 9,172,242 B2 | 10/2015 | Chang et al. | |
| 9,219,038 B2 | 12/2015 | Horng et al. | |
| 2008/0273403 A1* | 11/2008 | Ehrenreich ............ | G11C 29/02 365/194 |
| 2009/0033155 A1* | 2/2009 | Kanno ...................... | H02J 1/08 307/80 |
| 2012/0182079 A1* | 7/2012 | Kim ..................... | H03K 3/0315 331/57 |
| 2013/0193981 A1 | 8/2013 | Chen et al. | |

(Continued)

*Primary Examiner* — Paul Dinh
(74) *Attorney, Agent, or Firm* — Duane Morris LLP

(57) ABSTRACT

An IC degradation sensor is disclosed. The IC degradation management sensor includes an odd number of first logic gates electrically connected in a ring oscillator configuration, each first logic gate having an input and an output. Each first logic gate further includes a first PMOS transistor, a first NMOS transistor and a second logic gate having an input and an output. The input of the second logic gate is the input of the first logic gate, and the drains of the first PMOS transistor and the first NMOS transistor are electrically connected to the output of the second logic gate, and the output of the second logic gate is the output of the first logic gate.

19 Claims, 25 Drawing Sheets

(56) References Cited

U.S. PATENT DOCUMENTS

| | | |
|---|---|---|
| 2013/0246990 A1 | 9/2013 | Yen et al. |
| 2013/0320553 A1 | 12/2013 | Kuo et al. |
| 2014/0126274 A1 | 5/2014 | Lee et al. |
| 2014/0167799 A1 | 6/2014 | Wang et al. |
| 2014/0195728 A1 | 7/2014 | Hsu et al. |
| 2014/0239427 A1 | 8/2014 | Huang et al. |
| 2014/0266273 A1 | 9/2014 | Wang et al. |

* cited by examiner

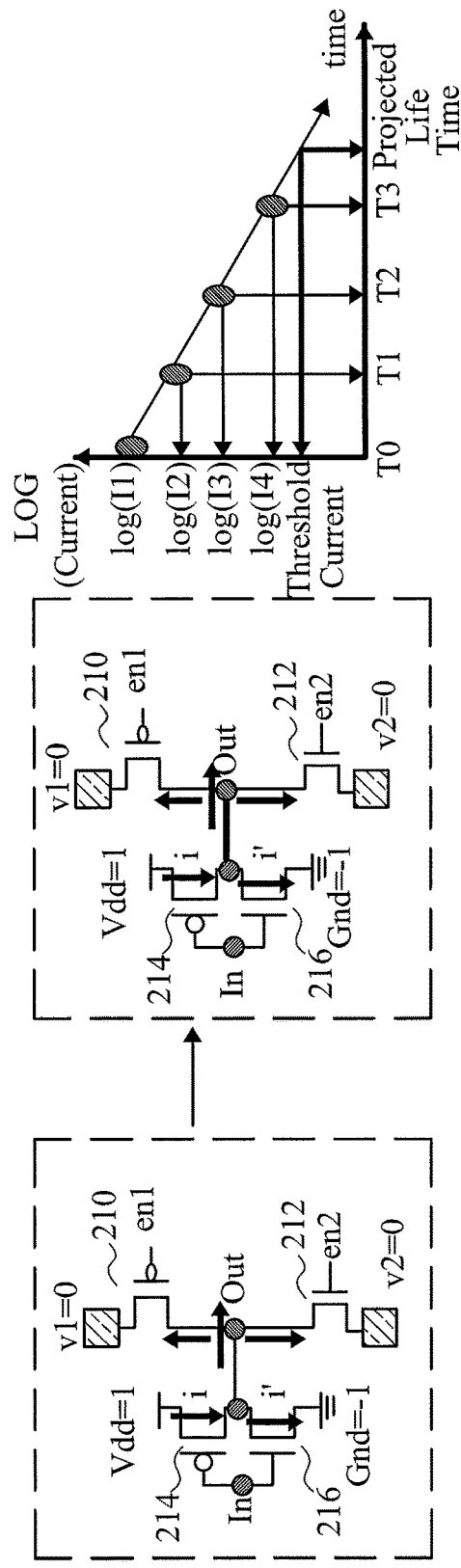

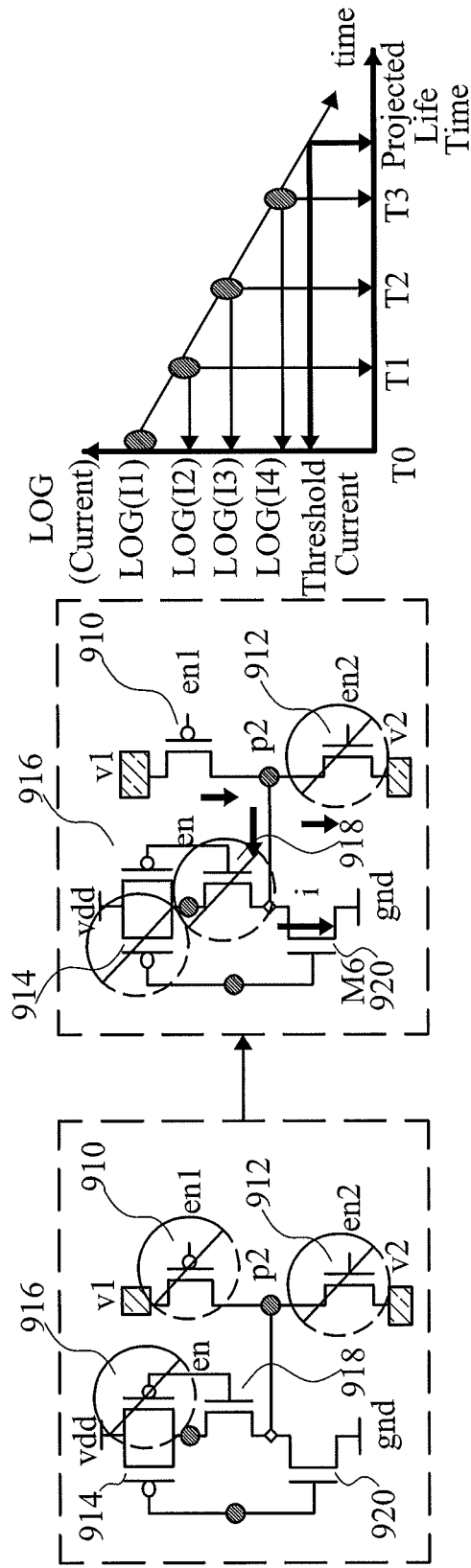

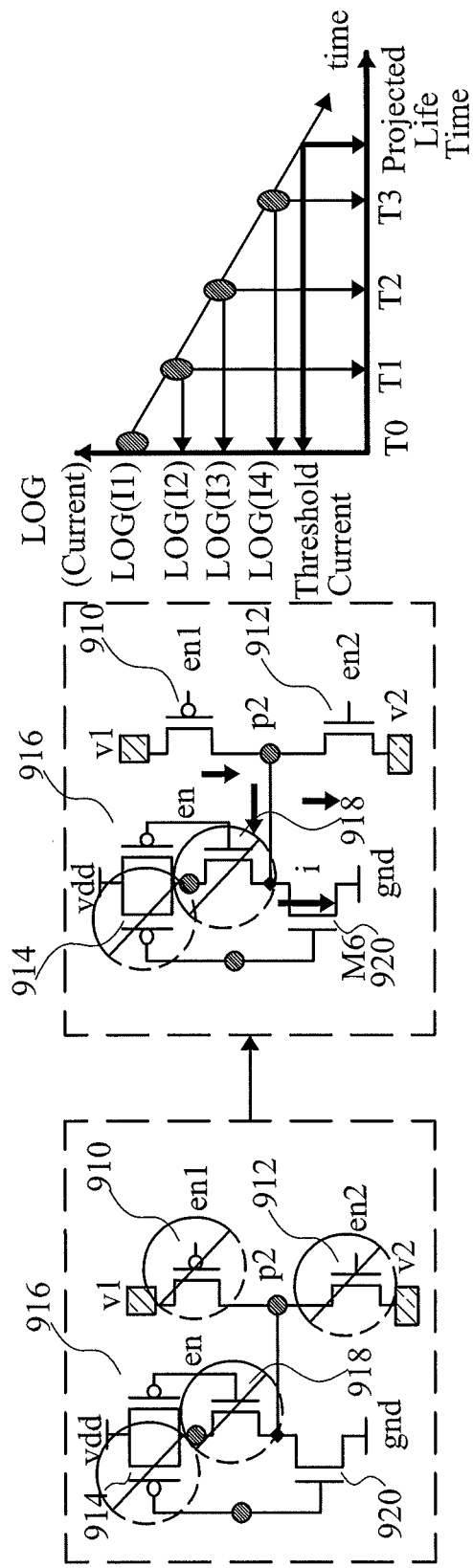

IC DEGRADATION MANAGEMENT CIRCUIT, SYSTEM AND METHOD

BACKGROUND

The Integrated Circuit (IC) design industry is facing unprecedented challenges as CMOS technology approaches its fundamental physics limit. Process viability, leakage power and device reliability issues have emerged as serious concerns that nullify the performance benefits gained by traditional device scaling. In particular, the parametric shifts or circuit failures caused by device reliability issues such as Bias Temperature Instability (BTI) and Hot Carrier Injection (HCI) have become more severe with shrinking device sizes and voltage margins. Aging-related circuit degradation has emerged as a new challenge to chip designers recently, because its impact was not significant in previous systems where the heat dissipation was moderate and operating margins were sufficient. The higher voltage stress and elevated temperatures in modern chips, however, are elevating circuit aging to become an increasingly important design consideration in high performance systems. Moreover, process improvements such as high-k/metal gate devices have introduced new degradation issues including positive-BTI (PBTI) in N-type devices, adding to the already complex aging behavior.

A major concern in IC designs (e.g., three-dimensional (3D) IC designs) is ensuring reliability and quality. Failure caused by aging and degradation affects the reliability and quality of IC components. Examples of known failure mechanisms include: (1) Electromigration (EM): a directional transport of electrons and metal atoms in interconnect wires leads to degradation and eventual failure; (2) Time-dependent dielectric breakdown (TDDB): wear-out of gate oxide caused by continued application of electric fields, which can lead to an electric short between the gate oxide and substrate; (3) Hot carrier injection (HCI): electrons that capture sufficient kinetic energy overcome the barrier to gate oxide layer and cause a threshold voltage shift and performance degradation; (4) Negative bias temperature instability (NBTI): holes trapped in the gate oxide layer cause the threshold voltage to shift. The switching between negative and positive gate voltages cause performance degradation and recovery from the NBTI degradation; (5) Stress migration (SM): mechanical stress due to the differences between the expansion rates of metals causes the failure; and (6) Thermal cycling (TC): fatigue accumulates in the silicon oxide layer with temperature cycles with respect to the ambient temperature. A ring oscillator is a device that includes an odd number of logic gates whose output oscillates between two voltage levels, representing true and false. The logic gates are typically attached in a chain and the output of the last logic gate is fed back into the first logic gate in the chain. High temperature is one cause of premature transistor aging and degradation. Ring oscillators are used as temperature sensors at the wafer level to monitor transistor aging by exploiting the linear relationship between oscillation frequency and temperature. In addition, aging and degradation resulting from various AC stress and DC stresses, such as PMOS HCI, PMOS BTI, NMOS HCI and NMOS BTI, can be tested and measured using ring oscillators.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7A is schematic diagram illustrating the stress mode setting of stress mode 3 shown in FIG. 4C, in accordance with some embodiments.

FIG. 7B is schematic diagram illustrating the measurement mode setting of stress mode 3 shown in FIG. 4C, in accordance with some embodiments.

FIG. 7C is a graph illustrating a linear relationship between the logarithm of DC current and the stress time of an inverter in stress mode 3 shown in FIG. 4C, in accordance with some embodiments.

FIG. 13A is a schematic diagrams illustrating the stress mode setting of stress mode 2 shown in FIG. 11B, in accordance with some embodiments.

FIG. 13B is a schematic diagrams illustrating the measurement mode setting of stress mode 2 shown in FIG. 11B, in accordance with some embodiments.

FIG. 13C is a graph illustrating a linear relationship between the logarithm of DC current and the stress time of an inverter in stress mode 2 shown in FIG. 11B, in accordance with some embodiments.

FIG. 14A is schematic diagram illustrating the stress mode setting of stress mode 3 shown in FIG. 11C, in accordance with some embodiments.

FIG. 14B is schematic diagram illustrating the measurement mode setting of stress mode 3 shown in FIG. 11C, in accordance with some embodiments.

FIG. 14C is a graph illustrating a linear relationship between the logarithm of DC current and the stress time of an inverter in stress mode 3 shown in FIG. 11C, in accordance with some embodiments.

DETAILED DESCRIPTION

Figure 1:
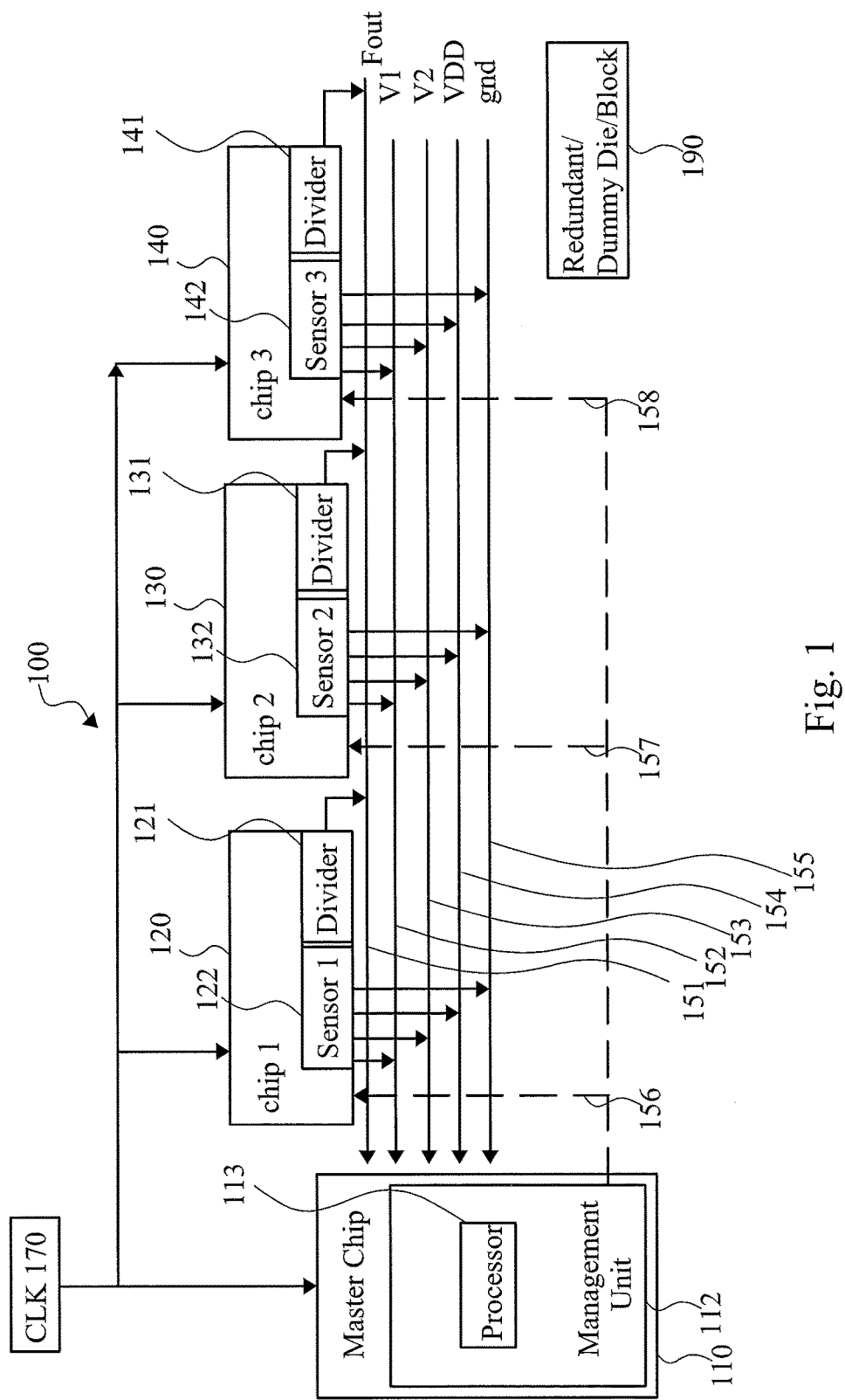
FIG. 1 is a block diagram of a system for degradation management, in accordance with some embodiments.

The following disclosure provides different exemplary embodiments for implementing various features of the subject matter. Specific examples of components and arrangements are described below to simplify understanding of the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

The operation of a MOSFET can be categorized into three different modes, depending on the voltages at the terminals. For an enhancement-mode, n-channel MOSFET, for example, the three operational modes are: (1) cutoff mode (also known as "sub-threshold" or "weak inversion" mode), when $V_{GS}<V_{th}$, where $V_{GS}$ is the gate-to-source bias voltage and $V_{th}$ is the threshold voltage for the device to turn on; (2) triode mode (also known as the "linear" or "ohmic" mode), when $V_{GS}>V_{th}$ and $V_{DS}<(V_{GS} V_{th})$; and (3) saturation mode (also known as "active" mode), when $V_{GS}>V_{th}$ and $V_{DS}>(V_{GS}-V_{th})$, where $V_{DS}$ is the drain-to-source voltage. The saturation drain current $I_{dsat}$ is the drain current in saturation mode, and the linear drain current $I_{dslin}$ is the drain current in linear or ohmic mode.

Hot carrier injection (HCI) is an effect exhibited by MOSFETs, where a carrier is injected from the conducting channel in the silicon substrate to the gate dielectric (SiO2). Bias temperature instability (BTI) is another degradation phenomenon affecting MOSFETs which are stressed with negative gate voltages at elevated temperatures.

In accordance with various embodiments, to test and measure aging and degradation caused by a particular stress type (e.g., AC, DC, HCI, BTI), a ring oscillator is configured to a stress mode setting corresponding to that particular stress type. In some embodiments, each stress mode setting is a group of voltages settings on various nodes of the ring oscillator. The ring oscillator is powered on under that stress mode setting for a period of time for stress testing, e.g., aging and degradation testing. After the testing period is over, the ring oscillator is switched to a different setting for stress parameters measurement. Under the measurement mode setting, the nodes of the ring oscillator are set to different voltages compared to the voltages applied in the stress mode setting. Then various signal characteristics regarding the ring oscillator (e.g., frequency) and certain transistors (e.g., amplitude of current and/or voltage values) are measured to reflect the aging and degradation condition of the transistors.

According to some embodiments, a number of different stress testing periods are implemented to obtain corresponding stress data. For example, the logarithm of the current in a certain transistor, or the logarithm of the frequency of the ring oscillator, decreases linearly with the accumulation of stress over time. Stress data is collected at different time points of stress accumulation. The group of such stress data can be analyzed to predict the remaining usable lifetime of devices such as transistors. According to some embodiments, a transistor is considered to be degraded, when the measured frequency of the ring oscillator or current in a certain transistor decreases to a predetermined threshold, e.g., a predetermined percentage of the initial value after a period of stress. Based on the linear relationship between stress time and logarithm of frequency or the logarithm of current, a corresponding threshold stress time can be determined for a threshold frequency or current. The threshold stress time is by definition the predicted lifetime of the transistors. Detailed discussions of stress modes/settings and measurement modes/settings are presented below with figures illustrating corresponding implementations. FIG. 1 illustrates a degradation management system 100 in accordance with one embodiment. The degradation management system 100 includes a master device or chip 110 containing a management unit 112 and a processor 113. The system 100 further includes three IC chips 120, 130 and 140, respectively, each including a respective divider 121, 131 and 141 and a respective sensor 122, 132 and 142. In some embodiments, the sensors 122, 132 and 142 are configured as degradation sensors under the control of the management unit 112. Exemplary embodiments of the sensors 122, 132 and 142 are described in further detail below. According to some embodiments, the management unit 112 selects a chip to test and measures its degradation characteristic. Each sensor 120, 130 and 140 has at least one testing mode (or stress mode) and at least one measurement mode. In other words, at least one set of voltages and/or currents for respective nodes is used for operating each sensor in testing mode, and at least one set of voltages and/or currents for respective nodes is used for operating each sensor in the measurement mode. Under the testing mode, a high voltage and/or a high current are applied to nodes of the selected chip for a period of time. Then a signal frequency or current at one or more nodes is measured during the measurement mode. Several iterations of testing and measurement are conducted to obtain a graph showing a linear relationship between time and the logarithm of a measured parameter (e.g., in a Time-log(Frequency) or Time-log(Current) scale), with the logarithm of a quantity such as frequency or current indicted by the vertical axis of the graph, and time indicated by the horizontal axis to predict the projected remaining lifetime of the selected chip. Similarly, the projected lifetime for all remaining chips coupled to the management unit 112 are obtained. When a chip reaches its projected lifetime, the management system powers off, or powers down (e.g. a predetermined reduction of power level) the chip. If there are sufficient system resources, the management system replaces powered-off, or powered-down chips with redundant chips 190 to maintain system performance. A more detailed discussion regarding the operation of the degradation sensors is provided below. Referring again to FIG. 1, each chip 120, 130 and 140 has a corresponding divider circuit 121, 131 and 141, respectively, in accordance with some embodiments. The divider circuits 121, 131 and 141 are configured to reduce an output frequency of each corresponding chip 120, 131 and 140 to be within a desired frequency range for measurement purposes, when the corresponding sensors 122, 132 and 142 are ring oscillators, for example. According to some embodiments, chip1 120, chip2 130 and chip3 140 all have identical ring oscillators as sensors 122, 132 and 142, respectively, embedded in them. Different embodiments of exemplary ring oscillators are described in further detail below. According to other embodiments, chip1 120, chip2 130 and chip3 140 all have identical delay lines as sensors 122, 132 and 142, respectively, embedded in them. An exemplary delay line is described in further detail below.

According to some embodiments, the master chip 110 includes a processor 113 for processing various signals received from chips 120, 130 and 140 during the measurement mode. According to some embodiments, the processor 113 may further include an analog-to-digital converter (ADC) (not shown) for analog to digital conversion of the received signals for purposes of digital processing of the resulting digital signals, and calculation of remaining lifetimes, as discussed in further detail below. As shown in FIG. 1, the processor 113 may be contained within the management unit 112 and also control the operations of the management unit 112. In alternative embodiments, the processor 113 may be a separate processor from that of the management unit 112. In various embodiments, the processor 113 may be implemented as a central processing unit (CPU) executing software stored in a memory (not shown), application specific integrated circuit (ASIC), programmable logic array, microcontroller, or any means for implementing logic circuitry or processing circuitry known in the art.

As shown in FIG. 1, according to some embodiments, the degradation management system 100 includes a number of shared signal lines, for example, a first signal line 151 (e.g., $F_{out}$) for communicating output frequency information between the master chip 110 and individual chips 120, 130 and 140. According to some embodiments, a common clock signal 170 is coupled to each of the master chip 110 and test chips 120, 130 and 140. The common clock signal 170 is provided to ensure that the same signal line 151 is properly shared among chips 120, 130 and 140. For example, at any given time, only one output frequency of a ring oscillator is communicated between a chip and the master chip 110, and every chip can have an equal share of time to communicate with the master chip 110. According to some embodiments, similar shared signal lines 152, 153, 154 and 155 are implemented to communicate other signals, e.g., V1, V2, Vdd and GND, respectively, between chips 120, 130 and 140, on the one hand, and the master chip 110, on the other hand, to implement the stress and measurement modes as described herein.

According to some embodiments, the management unit 112 on the master chip 110 has feedback control signal lines 156, 157 and 158 for communicating control signals back to chips 120, 130 and 140, respectively, for proper degradation management. The management unit 112 determines which chip to test, and when and how to test the chip. When a selected chip is under a stress test, the management unit 112 sends control signals to the selected chip to alternate between a stress mode setting and a measurement mode setting. The management unit 112 keeps the selected chip under a stress mode setting for a period of time and then switches the chip to a measurement mode setting. Under the measurement mode setting, various aging and degradation parameters are measured, as described in further detail below.

After processing various signals, e.g., Fout, V1, V2, Vdd and GND, as described in further detail below, and detecting various conditions (e.g., process, frequency, temperature, voltage) on each chip, the management unit 112 determines the aging and degradation conditions of each chip. In various embodiments, when degradation is predicted on a chip, the management unit 112 reduces the voltage on the chip to a predetermined level, or powers off the chip, at the predicted time to lower the temperature on that chip and to prevent any adverse impact to the system utilizing the chip that may otherwise be caused by the degraded chip at the end of its life time. According to some embodiments, redundant chips 190 are invoked to replace the degraded chip when the degraded chip's power is lowered, or shut off, to maintain overall system performance.

In various embodiments, depending on the resources available at a particular time, the management unit 112 can implement different strategies to maximize system performance or minimize system stress, or find a compromise between performance and a stress level of the system.

Figure 2A:
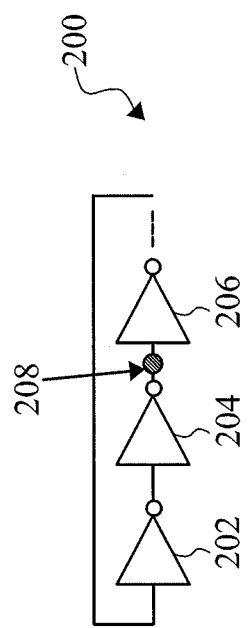
FIG. 2A is a schematic diagram of a ring oscillator containing odd stages of inverters, in accordance with some embodiments.

FIG. 2A is a schematic diagram of an inverter based ring oscillator containing odd stages of inverters, in accordance with some embodiments. The ring oscillator 200 includes odd identical inverters 202, 204 and 206 connected in series. The output of the inverter 202 is connected to the input of the inverter 204, and the output of the inverter 204 is connected to the input of the inverter 206. The output of the inverter 206 is connected to the input of the inverter 202. Node 208 is a monitor node where various signals are monitored.

Figure 2B:
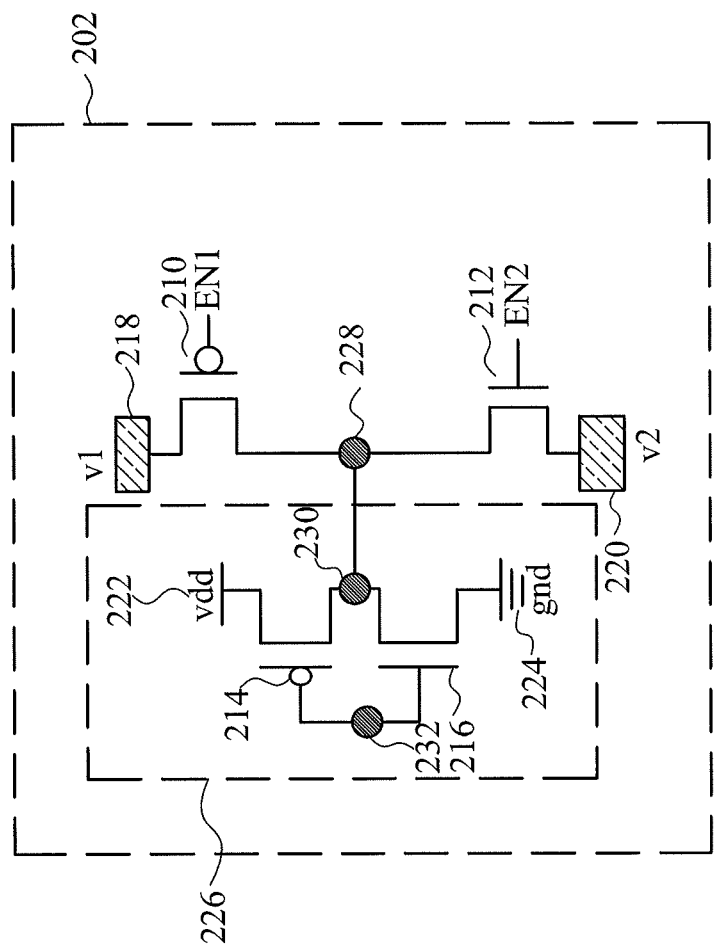
FIG. 2B is a schematic diagram of an inverter in the ring oscillator shown in FIG. 2A, in accordance with some embodiments.

FIG. 2B is a schematic diagram of an inverter 202 in the ring oscillator 200 shown in FIG. 2A, in accordance with some embodiments. According to some embodiments, the inverter 202 includes a first PMOS transistor 210, a first NMOS transistor 212, a second PMOS transistor 214 and the second NMOS transistor 216. According to some embodiments, the inverter 202 includes a standard CMOS inverter 226 (which further includes the second PMOS transistor 214 and the NMOS transistor 216) and an additional pair of MOSFETs (i.e., the PMOS transistor 210 and the NMOS transistor 212). The gates of the PMOS transistor 214 and the NMOS transistor 216 are connected together and labeled as node 232, which functions as the input node of both the inverter 226 and the inverter 202. The source of the PMOS transistor 214 is connected to a node Vdd, and the source of the NMOS transistor 216 is connected to the ground node. The drains of the PMOS transistor 214 and NMOS transistor 216 are connected together and labeled as node 230, which functions as the output node of both the inverter 226 and inverter 202. The drains of the PMOS transistor 210 and the NMOS transistor 212 are connected together as node 228. The nodes 228 and 230 are connected together. The node 228 functions as the output node of the inverter 214. The source of the PMOS transistor 210 is connected to a monitor node V1, and the source of the NMOS transistor 212 is connected to another monitor node V2. A monitor node is a node in the circuit that can be used to monitor certain parameters in the circuit, for example, various currents and voltages in the transistors. The gate of the PMOS transistor 210 is driven by an enable signal EN1, and the gate of the NMOS transistor 212 is driven by another enable signal EN2. Appropriate settings for signals EN1, EN 2 (i.e., different voltages applied to those nodes) are described in details in Table 1 below.

Figure 3:
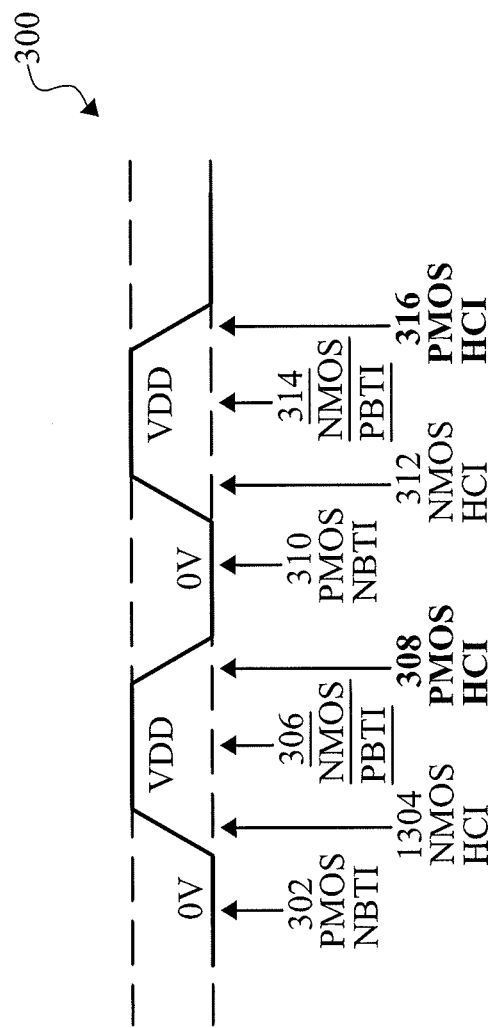
FIG. 3 is a diagram illustrating AC stresses applied to the ring oscillator shown in FIG. 2A, in accordance with some embodiments.

FIG. 3 is a diagram illustrating the AC stresses experienced at node 208 shown in FIG. 2A. According to some embodiments, when the power is turned on, the ring oscillator 200 starts to oscillate. At the node 208, when the voltage is 0V, the PMOS transistor 214 of the inverter 202 (same for 204 and 206) is under NBTI stress, labeled as 302 in FIG. 3. When the voltage goes up, the NMOS transistor 216 suffers HCI stress under AC condition, which is labeled as 304. When the voltage is Vdd, the NMOS transistor 216 suffers PBTI stress, which is labeled as 306. When the voltage goes down, the PMOS transistor 214 suffers HCI stress which is labeled as 308. Then the same cycle repeats.

Further, due to the addition of the MOSFET pair (i.e., the PMOS transistor 210 and the NMOS transistor 212) as discussed above, the circuit can be tested and measured under DC PMOS stress and DC NMOS stress. The DC PMOS stress is tested under DC PMOS stress mode setting, in which Vdd=1, ground is floating, EN2 is 1 and a negative bias voltage is applied on the V2 node to force the node 228 to 0. At this time, the node V1 is the monitor node. The DC parameters of the PMOS transistor 214 can be measured during this setting. The DC parameters of PMOS transistors include the threshold voltage $V_{th}$, the saturation drain current $I_{dstat}$.

For the NMOS DC HCI stress mode setting, Vdd is floating, ground=0, EN1 is ON and a positive bias voltage is applied on the node V1 to force node 228 to Vdd. At this time, the node V2 is the monitor node and the DC parameters of the NMOS transistor 216 can be measured during this setting. The DC parameters of NMOS transistors include the threshold voltage $V_{th}$, the saturation drain current $I_{dstat}$.

Table 1 summarizes different stress mode settings corresponding to the embodiment in FIG. 2B. According to some embodiments, DC stresses and AC stress can be tested and measured. In contrast, if the PMOS transistor 210 and the NMOS transistor 212 were not present within each inverter (i.e., 202, 204 and 206) of ring oscillator 200, then only AC stress can be tested and measured. Thus, the implementation of additional transistors 210 and 212 makes it possible to test additional circuit parameters and support additional types of stress testing.

TABLE 1

| Mode | vdd | gnd | en1 | v1 | en2 | v2 | Note |
|---|---|---|---|---|---|---|---|
| AC Stress | 1 | 0 | 1 | — | 0 | — | N/P MOS NBTI + HCI |
| DC HCI Stress PMOS | 1 | — | 1 | — | 1 | −1 | 1. PMOS HCI; 2. Vt/Idsat |
| DC HCI Stress NMOS | — | 0 | 0 | 1 | 0 | — | 1. NMOS HCI; 2. Vt/Idsat |

When the inverter circuit 202 shown in FIG. 2B is in AC stress mode setting, Vdd=1, GND=0, EN1=1, V1 is floating, EN2=0 and V2 is floating. During the AC stress mode setting, the following stresses are tested and measured: NMOS NBTI, PMOS NBTI, NMOS HCI and PMOS HCI. According to some embodiments, V1, V2 Vdd and GND are transmitted through signal lines 152, 153, 154, and 155 shown in FIG. 1.

When the inverter circuit 202 shown in FIG. 2B is in DC PMOS stress mode setting, Vdd=1, ground is floating, EN1=1, V1 is floating, EN2=1 and V2=0. During this DC PMOS stress mode, DC PMOS stress is tested and measured. The following PMOS DC parameters can be measured: the threshold voltage $V_{th}$, the saturation drain current $I_{dstat}$.

In DC NMOS stress mode setting, Vdd is floating, ground=0, EN1=0, V1=1, EN2=0 and V2 is floating. During this mode, DC NMOS HCI stress is tested and measured. The following DC NMOS parameters can be measured: the threshold voltage $V_{th}$, the saturation drain current $I_{dstat}$.

Figure 4C:
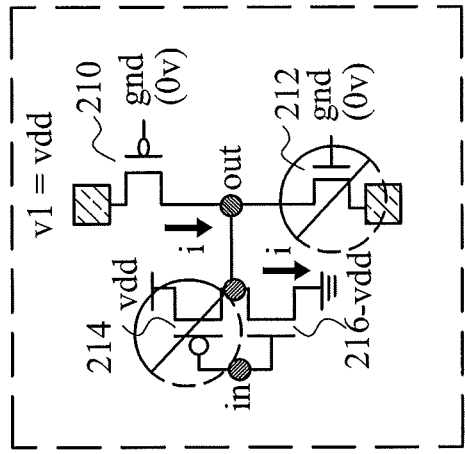
FIG. 4C is a schematic diagram illustrating stress mode 3 DC NMOS HCI stress applied to the inverter shown in FIG. 2B, in accordance with some embodiments.
Figure 4B:
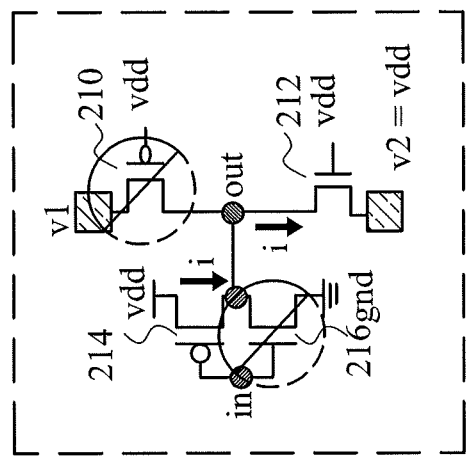
FIG. 4B is a schematic diagram illustrating stress mode 2 DC PMOS HCI stress applied to the inverter shown in FIG. 2B, in accordance with some embodiments.
Figure 4A:
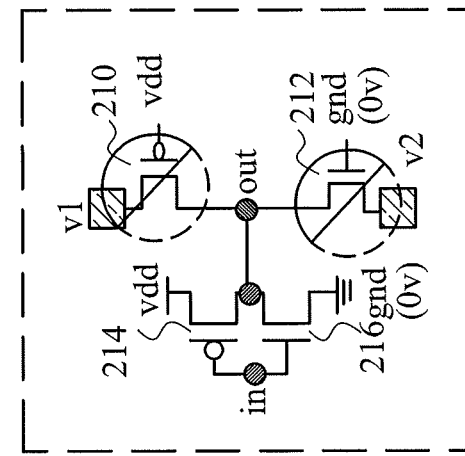
FIG. 4A is a schematic diagram illustrating stress mode 1 AC stress applied to the inverter shown in FIG. 2B, in accordance with some embodiments.

FIG. 4A-4C are schematic diagrams further illustrating the operations of three different stress modes shown in Table 1. In accordance with some embodiments, there are three different stress mode settings: the AC stress mode, the DC PMOS stress mode, and the DC NMOS stress mode. In FIG. 4A (i.e., Stress Mode 1, AC stress), the transistors 210 and 212 are turned off (turned off transistors are shown as circled and crossed "Ø" hereafter). The monitor nodes V1 and V2 are floating as shown in Table 1, EN1=Vdd (1) and EN2=GND (0). Detailed operation and measurement of stress mode 1 is described below in FIG. 5.

In FIG. 4B (i.e., Stress Mode 2, DC PMOS stress), the transistors 210 and 216 are turned off. The nodes GND and V1 are floating, Vdd=1, EN1=Vdd (1), EN2=Vdd (1), and the node V2 is set to 0 as shown in Table 1. MOS device parameters such as the drain saturation current $I_{dsat}$ can be measured. Detailed operation and measurement of stress mode 2 is described below in FIG. 6A-6C.

In FIG. 4C (i.e., Stress Mode 3, DC NMOS), the transistors 214 and 212 are turned off. The nodes V2 and Vdd are floating, GND=0, EN1=0, EN2=0 and V1=1 as shown in Table 1. MOS device parameters such as the drain saturation current $I_{dlin}$ can be measured. Detailed operation and measurement of AC stress mode is described below in FIG. 7A-7C.

Figure 5:
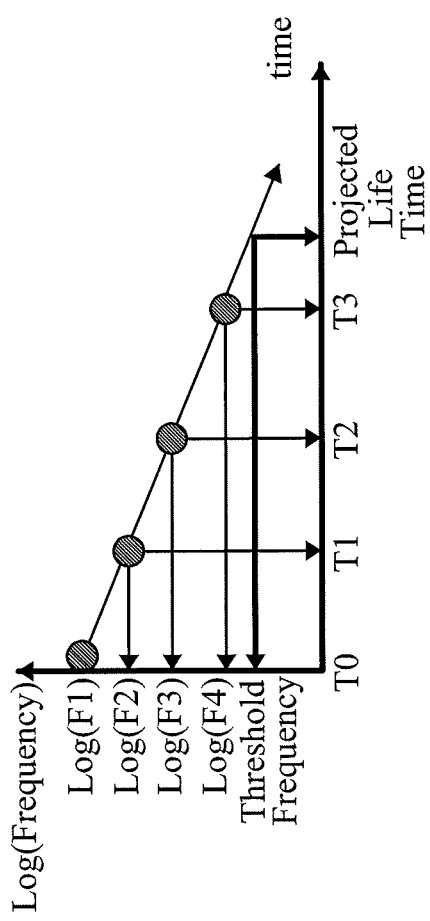
FIG. 5 is a graph illustrating a linear relationship between the logarithm of AC frequency and the stress time of an inverter in stress mode 1 shown in FIG. 4A, in accordance with some embodiments.

FIG. 5 is a graph illustrating a linear relationship between the logarithm of the AC frequency and the stress time of an inverter in stress mode 1 shown in FIG. 4A, in accordance with some embodiments. In stress mode 1 shown in FIG. 4A, after being powered on with the AC measurement mode setting, the initial frequency $F_1$ of the ring oscillator 200 is measured at time $T_0$. According to some embodiments, frequency is transmitted through signal line 151 $F_{out}$ shown in FIG. 1. Then the AC stress is applied for a time duration $T_1$, the transistors 214 and 316 are degraded under high temperature and high voltage. Then the ring oscillator frequency $F_2$ is measured again after the first period of stress (i.e., at time $T_1$). The system alternates between the AC stress mode setting and the AC measurement mode setting to obtain more pairs of corresponding stress time duration values and frequency values, e.g., $(T_2, F_3)$, $(T_3, F_4)$, etc. The AC stress mode setting values are: Vdd=1, gnd=0, EN1=1 and EN2=0. The transistors 210 and 212 shown in FIG. 4A are turned off during this setting.

As discussed above, when the ring oscillator 200 is under AC stress, the frequency of the ring oscillator decreases as a result of aging or degradation. According to some embodiments, several different measurements are conducted and several pairs of data points $(T_i, F_{i+1})$ are obtained and plotted on a T-log(F) scale. According to some embodiments, log(F) degreases linearly with time, so a linear relationship is extracted from these data points $(T_i, \log(F_{i+1}))$. A linear extrapolation is performed to generate a projected lifetime of the transistors. According to some embodiments, a threshold frequency is the frequency at a predetermined percentage of the initial frequency $F_1$. When the actual frequency (the frequency at a given point in time) is below the threshold frequency, the transistor is considered aged, or stressed out, or at the end of its usable lifetime. According to some embodiments, the projected lifetime of the transistor at a threshold frequency is implemented in a degradation management system to manage transistor degradation. The measurement under AC stress mode can obtain information regarding frequency degradation resulting from PMOS BTI, PMOS HCI, NMOS BTI and NMOS HCI under AC stresses.

Similar methods are implemented for other stress modes and other ring oscillator implementations, such as NAND gate based and NOR based ring oscillators. The linear relationship between the logarithm of a parameter (e.g., frequency and/or current) and stress time is used to calculated a projected lifetime of transistors. Detailed discussion of this method will not be repeated for other implementations. This method will only be referred to by reference followed by a brief description.

Figures 6A, 6B, 6C:
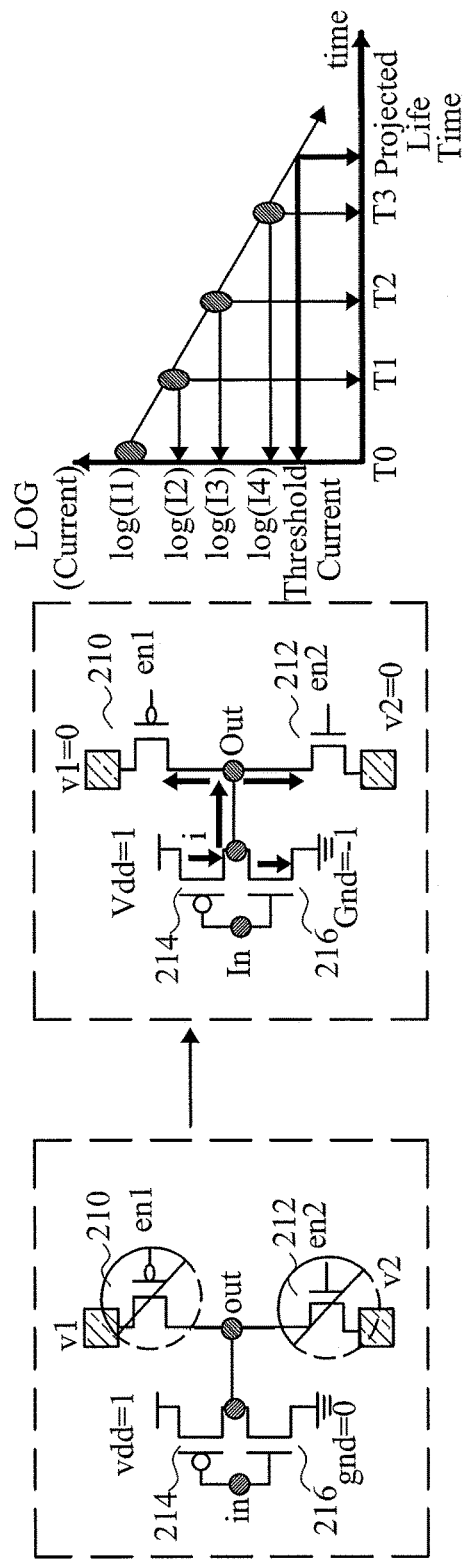
FIG. 6A is a schematic diagrams illustrating the stress mode setting of stress mode 2 shown in FIG. 4B, in accordance with some embodiments.
FIG. 6B is a schematic diagrams illustrating the measurement mode setting of stress mode 2 shown in FIG. 4B, in accordance with some embodiments.
FIG. 6C is a graph illustrating a linear relationship between the logarithm of DC current and the stress time of an inverter in stress mode 2 shown in FIG. 4B, in accordance with some embodiments.

FIGS. 6A-6C are schematic diagrams illustrating the operation of the stress mode 2 (i.e., DC PMOS Stress) and the measurement of DC parameters. During mode 2, after being powered on under the DC measurement mode setting (FIG. 6B), the initial current $I_1$ in the PMOS transistor 214 flowing from the source Vdd to the drain is measured. Then AC stress is applied for a first period of time $T_1$, the transistors 214 and 216 are degraded or aged under high temperature and high voltage. Then DC current $I_2$ in the PMOS transistor 214 is measured again. The system alternates between the AC stress mode setting (FIG. 6A) and the DC measurement mode setting (FIG. 6B) to obtain more pairs of corresponding stress time period values and current values, $(I_3, T_2)$, $(I_4, T_3)$, etc. During the AC stress mode setting (FIG. 6A), Vdd=1, GND=0, EN1=1, and EN2=0. During the DC measurement mode setting (FIG. 6B), Vdd=1, GND=−1, EN1=0, EN2=1, V1=0, and V2=0.

FIG. 6C is a graph illustrating a linear relationship between the logarithm of the DC current and the stress time of an inverter during the stress mode 2 shown in FIG. 4B, in accordance with some embodiments. Similar to the method illustrated in FIG. 5, according to some embodiments, several pairs of data points $(T_i, I_{i+1})$ are obtained and plotted on a T-Log(I) scale. A linear relationship is extracted from these data points $(T_i, \log(I_{i+1}))$ to predict a projected lifetime of the transistor at a threshold current. According to some embodiments, the threshold current, is defined as a percentage of the initial current $I_1$. When the current is below the threshold current, the transistor is considered aged, or stressed out, or reaching the limit of its lifetime. According to some embodiments, the projected lifetime of the transistor at a threshold current is implemented in an degradation management system to manage transistor degradation. This measurement during the mode 2 can obtain information regarding current degradation resulting from PMOS BTI, PMOS HCI, NMOS BTI and NMOS HCI under AC stress.

FIG. 7A-7C are schematic diagrams illustrating the operation of the stress mode 3 (i.e., DC NMOS stress) and the measurement of DC parameters. During mode 3, after being powered on under the DC measurement mode setting (FIG. 7B), the initial current $I_1$ in the PMOS transistor 214 flowing from the source Vdd to the drain is measured. Then the DC stress is applied for a first period of time $T_1$, the transistors 214 and 216 are degraded or aged under high temperature and high voltage. Then the DC currents $I_2$ in the PMOS transistor 214 flowing from the source Vdd to the drain is measured again. The system alternates between the DC stress mode setting (FIG. 7A) and the DC measurement mode setting (FIG. 7B) to obtain more pairs of stress time period values and corresponding current values, $(T_2, I_3)$, $(T_3, I_4)$, etc. During DC stress mode setting (FIG. 7A), Vdd=1, GND=−1, EN1=0, EN2=1, V1=0, and V2=0. The DC measurement mode setting (FIG. 7B) is: Vdd=1, GND=−0.1, EN1=0, EN2=1, V1=0, and V2=0.

FIG. 7C is a graph illustrating a linear relationship between the logarithm of the DC current and the stress time of the inverter in stress mode 3 shown in FIG. 4C, in accordance with some embodiments. According to some embodiments, a linear relationship is extracted from data points $(T_i, \log(I_{i+1}))$ to predict a projected lifetime of the transistors at a threshold current. This measurement under mode 3 can obtain information regarding current degradation resulting from PMOS BTI, PMOS HCI, NMOS BTI and NMOS HCI under DC stress.

Figures 8A, 8B, 8C:
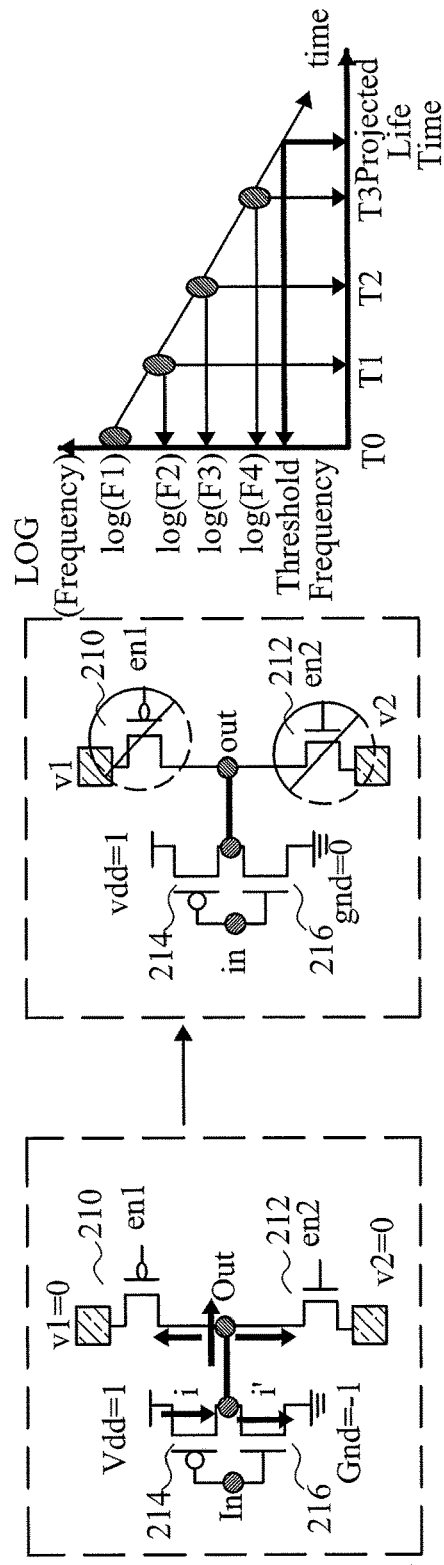
FIG. 8A is schematic diagram illustrating the stress mode setting of stress mode 4, in accordance with some embodiments.
FIG. 8B is schematic diagram illustrating the measurement mode setting of stress mode 4, in accordance with some embodiments.
FIG. 8C is a graph illustrating a linear relationship between the logarithm of AC frequency and the stress time of an inverter in stress mode 4, in accordance with some embodiments.

FIGS. 8A-8C are schematic diagrams illustrating the operation of stress mode 4 (i.e., DC NMOS BTI stress) and the measurement of DC parameters. During the mode 4, after being powered on under the AC measurement mode setting (FIG. 8B), the initial frequency $F_1$ of the ring oscillator is measured. Then DC stress is applied for a period of time $T_1$, similar to discussions above, the transistors 214 and 216 are degraded or aged under high temperature and high voltage. Then the ring oscillator frequency $F_2$ is measured again. The system alternates between the DC stress mode setting (FIG. 8A) and the AC measurement mode setting (FIG. 8B) to obtain more pairs of stress time period value and corresponding frequency value, $(T_2, F_3)$, $(T_3, F_4)$, etc. During the DC stress mode setting (FIG. 8A), Vdd=1, GND=−1, EN1=0, and EN2=0, V1=0 and V2=0. During the AC measurement mode setting (FIG. 8B), Vdd=1, gnd=0, EN1=1 and EN2=0.

FIG. 8C is a graph illustrating a linear relationship between the logarithm of AC frequency and the stress time of the inverter during the stress mode 4, in accordance with some embodiments. According to some embodiments, a linear relationship is extracted from data points $(T_i, \log(F_{i+1}))$ to predict a projected lifetime of the transistors at a threshold frequency. This measurement under the mode 4 can obtain information regarding current degradation resulting from PMOS BTI, PMOS HCI, NMOS BTI and NMOS HCI under DC stress.

Figure 9A:
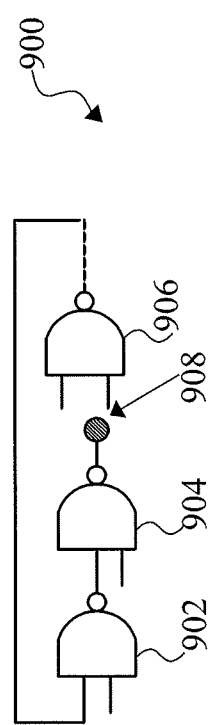
FIG. 9A is a schematic diagram of a ring oscillator containing odd stages of NAND gates, in accordance with some embodiments.
Figure 9B:
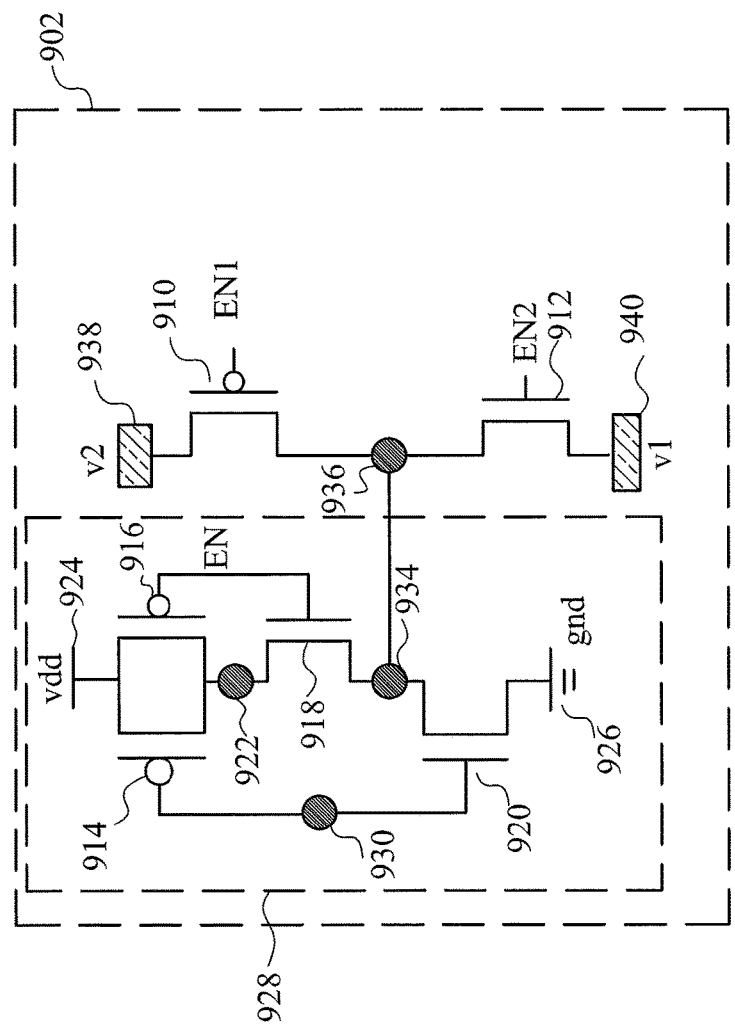
FIG. 9B is a schematic diagram of a NAND gate in the ring oscillator shown in FIG. 9A, in accordance with some embodiments.

FIG. 9A is a schematic diagram of a NAND based ring oscillator 900 containing odd stages of NAND gates in accordance with some embodiments. The ring oscillator 900 includes odd identical NAND gates 902, 904 and 906. The structure of the NAND gate 902 is illustrated in FIG. 9B, in accordance to some embodiments. The NAND gate 902 includes: a first PMOS transistor 910, a first NMOS transistor 912, a second PMOS transistor 914, a second NMOS transistor 920, a third PMOS transistor 916 and a third NMOS transistor 918. According to some embodiments the NAND gate 902 includes standard NAND gate 928 and an additional a pair of MOSFET's (i.e. the PMOS transistor 910 and the NMOS transistor 912). The gate of the PMOS transistor 914 and the gate of the NMOS transistor 920 are connected together and labeled as node 930, or the input node. The sources of the PMOS transistor 914 and 916 are both connected to the node Vdd. The drains of the PMOS transistor 914 and 916 are connected together and labeled as node 932. The node 932 is further connected to the source of the NMOS transistor 918. The gates of the PMOS transistor 916 and the NMOS transistor 918 are connected together and is labeled as node EN. The drain of the NMOS transistor 918 is connected to the drain of the NMOS transistor 920, and labeled as node 934, or the output node. The drain of the PMOS transistor 910 and the drain of the NMOS transistor 912 are connected together and labeled as node 936. The nodes 936 and 934 are connected together. The source of the NMOS transistor 920 is connected to the ground. The source of the PMOS transistor 910 is connected to a node V2, and the gate of the PMOS transistor 910 is driven by a signal EN2. The gate of the NMOS transistor 912 is driven by a signal EN1, and the source of the NMOS transistor 912 is connected to a node V1.

Figure 10:
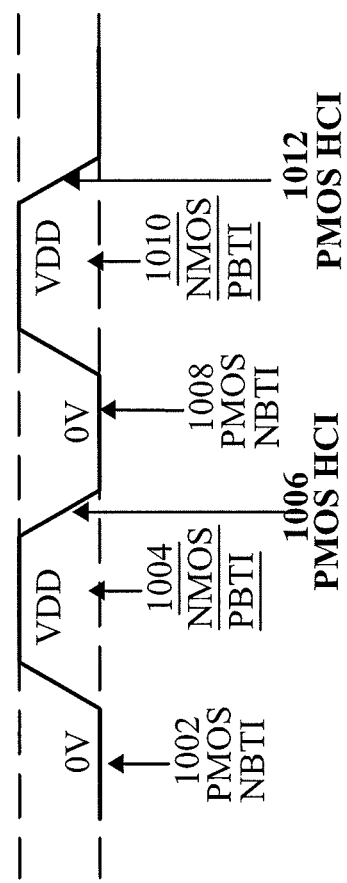
FIG. 10 is a diagram illustrating AC stresses applied to the ring oscillator shown in FIG. 9A, in accordance with some embodiments.

FIG. 10 is a diagram illustrating the AC stress and the DC PBTI stress in accordance with some embodiments shown in FIG. 9B. When the power is turned on and EN is set to 1, the ring oscillator 900 starts to oscillate in AC stress mode. At node 908 shown in FIG. 9A, when the voltage is 0V, the PMOS transistor 914 is under NBTI stress, labeled as 1002. When the voltage is Vdd, the NMOS transistors 918 and 920 are under PBTI stress, labeled as 1004. When the voltage goes down, the PMOS transistor 914 suffers HCI stress under AC condition, labeled as 1006. Then the cycle repeats itself. In comparison, when power is on and EN=0, the NMOS transistors 918 and 920 suffer DC PBTI stress.

In FIG. 9B, in addition to the AC stress and the DC PBTI stress, the DC HCI stress can also be tested due to the implementation of an additional MOSFET pair discussed above. For NMOS DC HCI stress, Vdd is floating and ground is 0, EN2 is ON and a positive bias voltage is applied on V2 to force node 936/934 to Vdd. At this time, the node V2 is the monitor node. DC parameters of NMOS transistor 916 can be measured during this setting.

Table 2 summarizes the different stress mode settings corresponding to the embodiment in FIG. 9B. When the NAND circuit 902 in FIG. 9B is in AC stress mode setting, EN=1, EN1=1, EN2=1 and node V1 is floating. During this mode, the following stresses can be tested and measured: NMOS PBTI, PMOS NBTI and NMOS HCI. When the NAND circuit 902 is in DC BTI stress mode setting, EN=0, EN1=1, EN2=1 and V1 is floating. During this mode, NMOS PBTI can be tested and measured. When in DC HCI stress mode, EN=0, EN1=0, EN2=0 and V1=1. During this mode, NMOS HCI can be tested and measured.

TABLE 2

| Mode | en | en1 | en2 | v1 | Note |
|---|---|---|---|---|---|
| AC Stress | 0 | 0 | 0 | | NMOS PBTI + HCI; PMOS NBTI. |
| DC Stress BTI | 1 | 0 | 0 | | PMOS NBTI. |
| DC Stress HCI | 1 | 1 | 1 | 0 | 1. PMOS HCI; 2. Drain voltage from node v2; 3. PMOS current from node v1. |

Figure 11C:
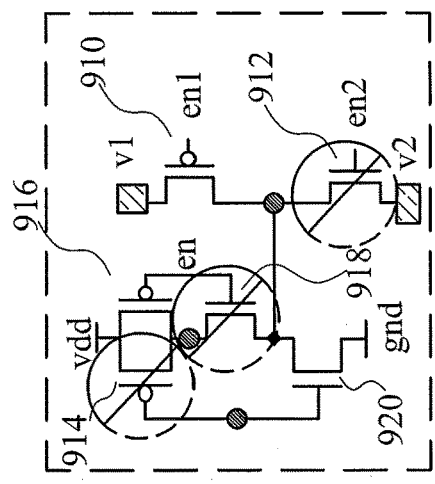
FIG. 11C is a schematic diagram illustrating stress mode 3 DC NMOS HCI stress applied to the inverter shown in FIG. 9B, in accordance with some embodiments.
Figure 11B:
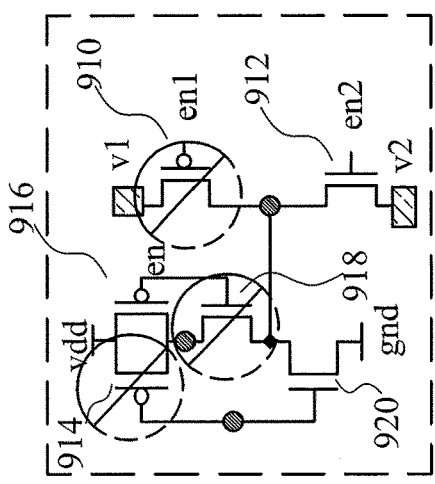
FIG. 11B is a schematic diagram illustrating stress mode 2 DC NMOS BTI stress applied to the NAND gate shown in FIG. 9B, in accordance with some embodiments.
Figure 11A:
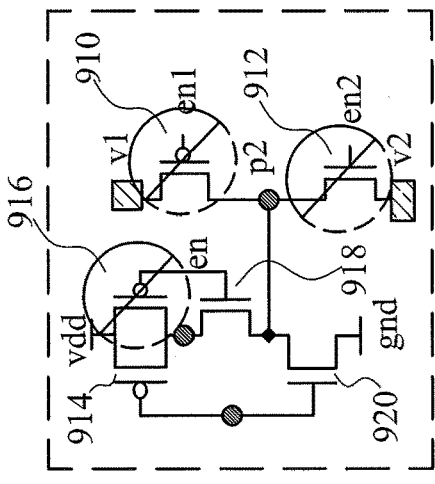
FIG. 11A is a schematic diagram illustrating stress mode 1 AC stress applied to the NAND gate shown in FIG. 9B, in accordance with some embodiments.

FIGS. 11A-11C are schematic diagrams illustrating the operations of three different stress modes in Table 2. There are three different stress modes as shown in Table 2: Stress Mode 1 (FIG. 11A): the AC stress mode; Stress Mode 2 (FIG. 11B): the DC PMOS stress mode; and Stress Mode 3 (FIG. 11C): the DC NMOS stress mode.

As illustrated in FIG. 11A, during Stress Mode 1 (AC stress), the transistors 910, 912 and 916 are turned off. The monitor node V1 is floating as shown in Table 2, EN=0, EN1=0 and EN2=0. The following AC stresses are tested and measured: PMOS BTI, PMOS HCI, NMOS BTI.

In FIG. 11B, Stress Mode 2 (DC PMOS stress), the transistors 910, 914 and 918 are turned off. The node V1 is floating, EN=1, EN1=0 and EN2=0 as shown in Table 2. The following AC stresses are tested and measured: PMOS BTI, PMOS HCI, NMOS BTI. Detailed operation and measurement of AC stress mode is described below in FIG. 13A-13C.

In FIG. 11C, Stress Mode 3 (DC NMOS stress), the transistors 912, 914 and 918 are turned off. As shown in Table 2, EN=1, EN1=1, EN2=1 and V1=0. The DC NMOS BTI stress is measured.

Figure 12:
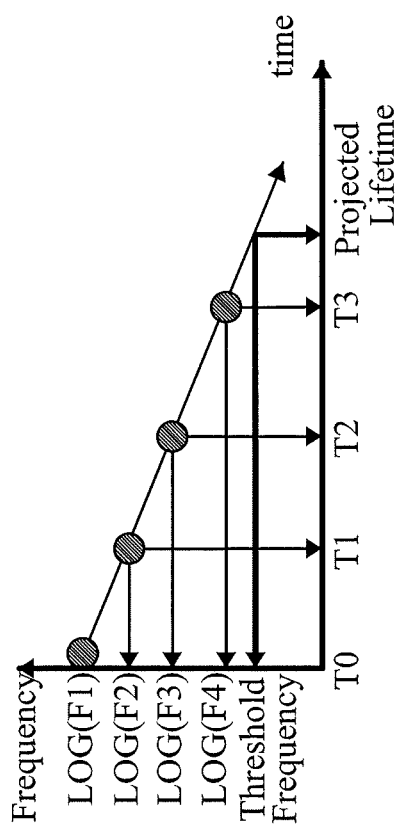
FIG. 12 is a graph illustrating a linear relationship between the logarithm of AC frequency and the stress time of NAND gate in stress mode 1 shown in FIG. 11A, in accordance with some embodiments.

FIG. 12 is a graph illustrating a linear relationship between the logarithm of the AC frequency and the stress time of the NAND gate in stress mode 1 shown in FIG. 11A, in accordance with some embodiments. During mode 1, the AC stress is applied and the AC frequency is measured. The AC stress mode setting is: Vdd=1, GND=0, EN1=1 and EN2=0. The transistors 910, 912 and 916 are turned off under this setting.

During the AC stress mode setting, similar to the method shown in FIG. 5, a linear relationship is extracted from data points $(T_i, \log(F_{i+1}))$ to predict a projected lifetime of the transistors at a threshold frequency. This measurement under the AC stress mode can obtain information regarding frequency degradation resulting from PMOS BTI, PMOS HCI and NMOS BTI AC stress.

FIG. 13A-13C are schematic diagrams illustrating the operation of stress mode 2 (DC BTI stress) and the measurement of DC parameters. During mode 2, after being powered on under the DC measurement mode setting (FIG. 13B), the initial current $I_1$ in the NMOS transistor 920 flowing from the drain to the source is measured. Then the AC stress is applied for a first period of time $T_1$, the transistors 914, 918 and 920 are degraded or aged under high temperature and high voltage. Then DC currents $I_2$ in the NMOS transistor 920 flowing from the drain to the source is measured again. The system alternates between the AC stress mode setting (FIG. 13A) and DC measurement mode setting (FIG. 13B) to obtain more pairs of stress time period values and corresponding current values, $(T_2, I_3)$, $(T_3, I_4)$, etc. The AC stress mode setting (FIG. 13A) is Vdd=1, GND=0, EN1=1, and EN2=0. The DC measurement mode setting (FIG. 13B) is Vdd=1, GND=−1, EN1=0, EN2=1, V1=0, and V2=0.

FIG. 13C is a graph illustrating a linear relationship between the logarithm of the DC current and the stress time of the inverter in stress mode 2 shown in FIG. 11B, in accordance with some embodiments. Similar to the method shown in FIG. 5, a linear relationship is extracted from data points $(T_i, I_{i+1})$ to predict a projected lifetime of the transistors at a target current. This measurement under mode 2 can obtain information regarding transistor degradation resulting from NMOS BTI under AC stress.

FIG. 14A-14C are schematic diagrams illustrating the operation of the stress mode 3 (DC HCI stress) and the measurement of DC parameters. During mode 3, the DC stress is applied and the DC currents are measured. During the mode 3, after being powered on under the DC measurement mode setting (FIG. 14B), the initial current $I_1$ in the NMOS transistor 920 flowing from the drain to the source is measured. Then the AC stress is applied for a first period of time $T_1$ and the transistors 916 and 920 are degraded under high temperature and high voltage. Then the DC currents $I_2$ in the NMOS transistor 920 flowing from the drain to the source is measured again. Then the system alternates between the DC stress mode setting (FIG. 14A) and the DC measurement mode setting (FIG. 14B) to obtain more pairs of stress time period values and corresponding current values, $(T_2, I_3)$, $(T_3, I_4)$, etc. The DC stress mode setting (FIG. 14A) is Vdd=1, gnd=0, EN1=0, EN2=1 and EN=0. The DC measurement mode setting (FIG. 14B) is Vdd=1, GND=−1, EN1=0, EN2=1, V1=0, and V2=0.

FIG. 14C is a graph illustrating a linear relationship between the logarithm of the DC current and the stress time of the inverter in stress mode 3 shown in FIG. 11C, in accordance with some embodiments. Similar to the method shown in FIG. 5, a linear relationship is extracted from these data points $(T_i, \log(I_{i+1}))$ to predict a projected lifetime of the transistors at a target current. This measurement under mode 3 can obtain information regarding current degradation resulting from NMOS BTI DC stress.

Figure 15A:
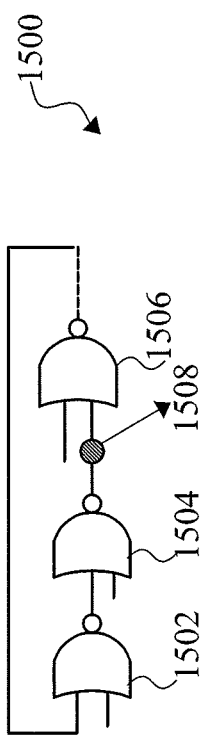
FIG. 15A is a schematic diagram of a ring oscillator containing odd stages of NOR gates, in accordance with some embodiments.
Figure 15B:
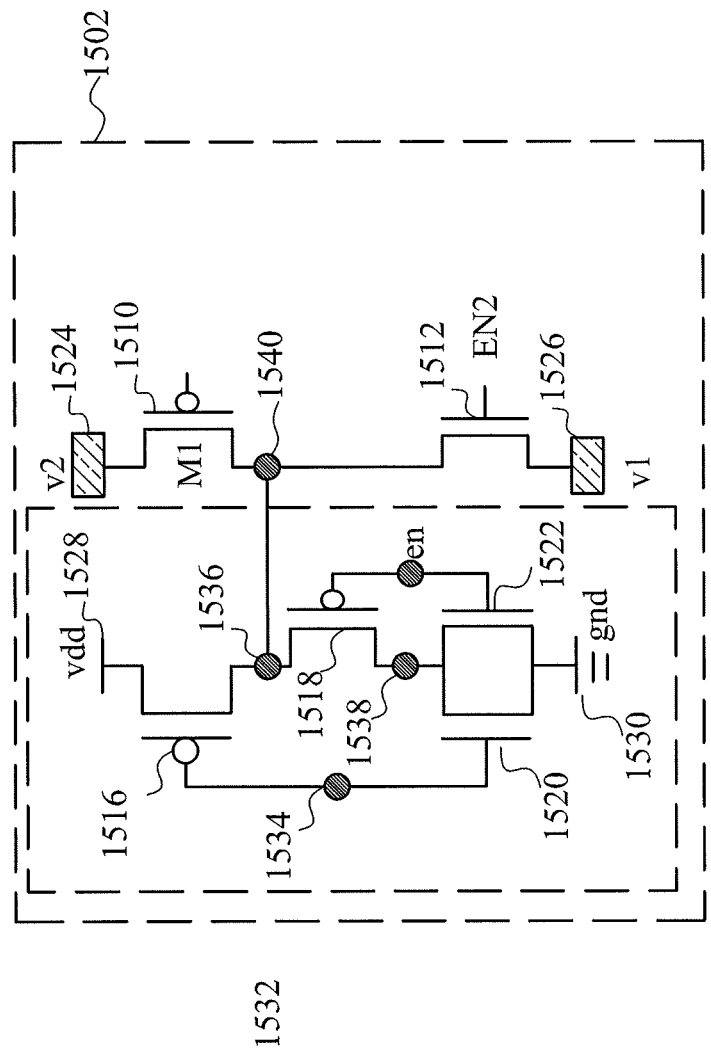
FIG. 15B is a schematic diagram of a NOR gate in the ring oscillator shown in FIG. 15A, in accordance with some embodiments.

FIG. 15A is a schematic diagram of a NOR gate based ring oscillator 1500 containing odd stages of NOR gates, in accordance with some embodiments. The ring oscillator 1500 includes odd identical NOR gates 1502, 1504 and 1506. The structure of the NOR gate 1502 according to some embodiments is illustrated in FIG. 15B. The ring oscillator 1500 includes: a first PMOS transistor 1510, a first NMOS transistor 1512, a second PMOS transistor 1516, a third PMOS transistor 1518, a second NMOS transistor 1520 and a third NMOS transistor 1522. According to some embodiments the NOR gate 1502 includes a standard NOR gate 1532 and an additional pair of MOSFET's (i.e. the PMOS transistor 1510 and the NMOS transistor 1512). The source of the PMOS transistor 1516 is connected to the node Vdd. The gates of the PMOS transistor 1516 and the NMOS transistor 1520 are connected together and are labeled as node 1534. The drain of the PMOS transistor 1516 is connected to the source of the PMOS transistor 1518, and labeled as node 1536. The drain of the PMOS transistor 1510 and the drain of the NMOS transistor 1512 are connected together and is labeled as node 1540. The node 1540 and the node 1536 are connected together as node 1536. The source of the PMOS transistor 1510 is connected to the node V1. The gate of the PMOS transistor 1510 is driven by a signal EN1. The gates of the PMOS transistor 1518 and the NMOS transistor 1522 are connected together and are driven by a signal EN. The drains of the NMOS transistors 1522 and 1520 are connected together and labeled as node 1538. The node 1538 is connected to the source of the PMOS transistor 1518. The sources of the NMOS transistors 1522 and 1520 are connected together and are grounded. The gate of the NMOS transistor 1512 is driven by the signal EN2 and the source of the NMOS transistor 1512 is connected to the node V2.

In FIG. 15B, in addition to AC stress and DC NBTI stress, due to the implementation of an additional MOSFET pair discussed above, DC stress can also be tested and measured. For PMOS DC stress, Vdd=1 and ground is floating, EN2 is ON and a negative bias voltage is applied on node V2 to force node 1536 to 0. At this time, the node V1 serves as the monitor node. The DC parameters of the PMOS transistor 1516 are measured under this setting. The DC parameters include: the drain voltage on V2, the NMOS transistor current of on V1.

Figure 16:
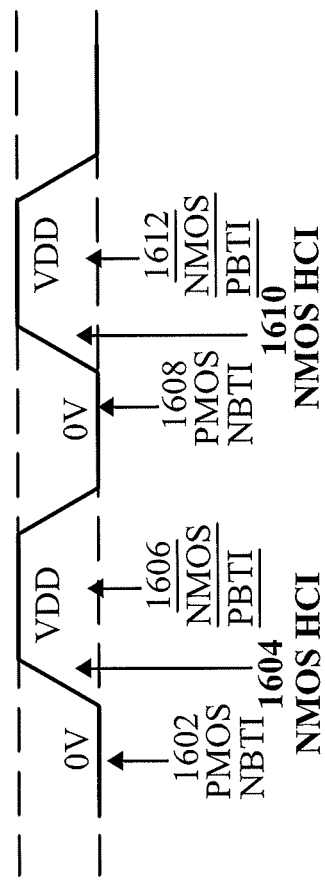
FIG. 16 is a diagram illustrating AC stresses applied to the ring oscillator shown in FIG. 15A, in accordance with some embodiments.

FIG. 16 is a diagram illustrating the AC stress and DC stress in FIG. 15B in accordance with some embodiments. When the power is turned on and EN=0, the ring oscillator 1500 starts to oscillate. At node 1508 shown in FIG. 15A, when voltage is 0V, the PMOS transistors 1516 and 1518 are under NBTI stress, labeled as 1602. When the voltage is Vdd, the NMOS transistors 1520 are under PBTI and HCI stress, labeled as 1606. As signal goes up, NMOS transistors 1520 suffer HCI stress (e.g., 1604) under the AC condition.

Table 3 summarizes the different stress mode settings corresponding to the embodiment in FIG. 15B.

TABLE 3

| Mode | en | en1 | en2 | v1 | Note |
|---|---|---|---|---|---|
| AC Stress | 1 | 1 | 1 | | NMOS PBTI; PMOS NBTI + HCI. |
| DC Stress BTI | 0 | 1 | 1 | | NMOS PBTI |
| DC Stress HCI | 0 | 0 | 0 | 1 | 1. NMOS HCI; 2. Drain voltage from node v2; 3. NMOS current from node v1. |

Figures 17A, 17B, 17C:
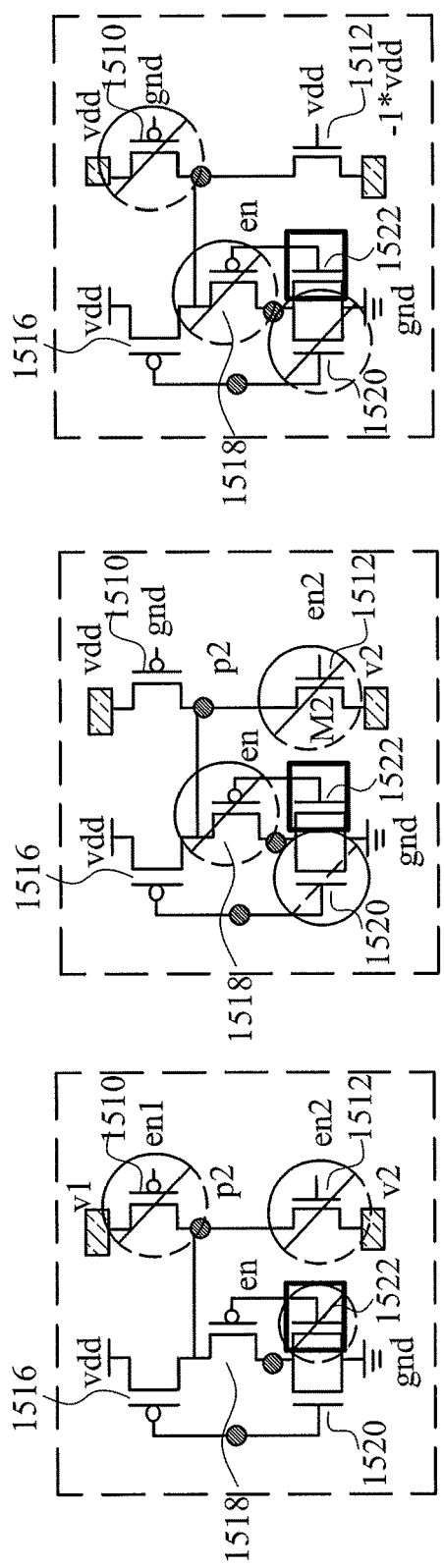
FIG. 17A is a schematic diagram illustrating stress mode 1 AC stress applied to the NOR gate shown in FIG. 15B, in accordance with some embodiments
FIG. 17B is a schematic diagram illustrating stress mode 2 DC PMOS BTI stress applied to the NOR gate shown in FIG. 15B, in accordance with some embodiments.
FIG. 17C is a schematic diagram illustrating stress mode 3 DC PMOS HCI stress applied to the inverter shown in FIG. 15B, in accordance with some embodiments.

FIG. 17A-17C are schematic diagrams illustrating the operations of three different stress modes shown in Table 3. There are three different stress modes as shown in Table 3: Stress Mode 1, the AC stress mode; Stress Mode 2, the DC NMOS stress mode; and Stress Mode 3, the DC PMOS stress mode. As illustrated in FIG. 17A, Stress Mode 1 (AC stress), the transistors 1510, 1512 and 1522 are turned off. The monitor node V1 is floating as shown in Table 3, EN=0, EN1=1 and EN2=0. Detailed operation and measurement of stress mode 1 is described below in FIG. 18.

In FIG. 17B, Stress Mode 2 (DC NMOS stress), the transistors 1512, 1518 and 1520 are turned off. The node V1 is floating, EN=1, EN1=0, and EN2=0 as shown in Table 3. NMOS PBTI stress is tested and measured.

Figure 20:
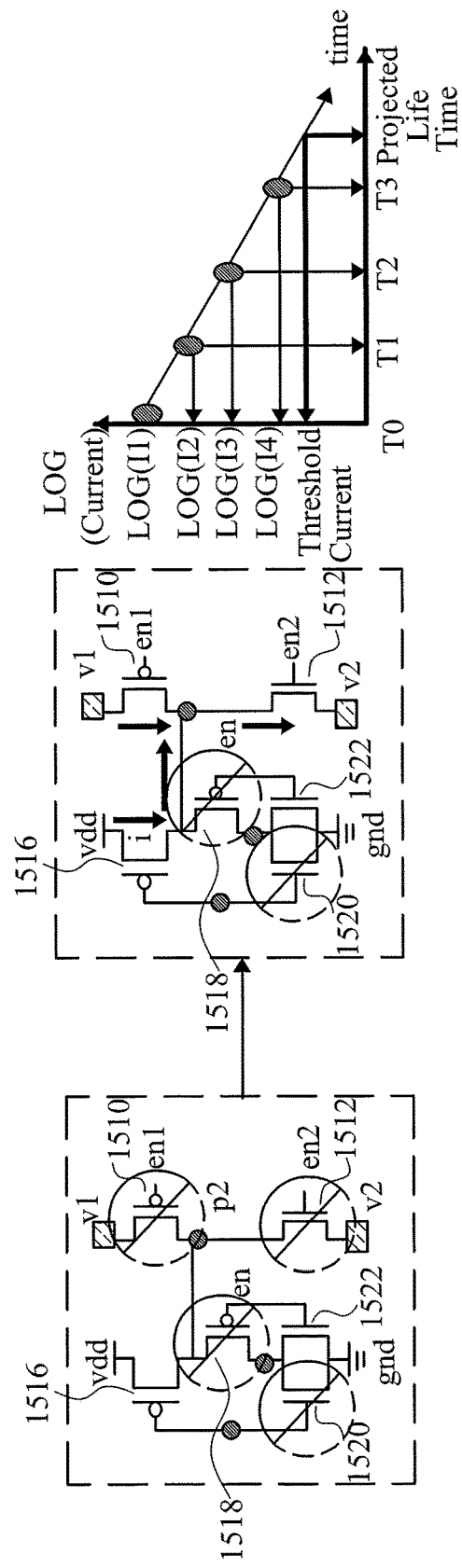
FIG. 20A is schematic diagram illustrating the stress mode setting of stress mode 3 shown in FIG. 17C, in accordance with some embodiments.
FIG. 20B is schematic diagram illustrating the measurement mode setting of stress mode 3 shown in FIG. 17C, in accordance with some embodiments.
FIG. 20C is a graph illustrating a linear relationship between the logarithm of DC current and the stress time of an inverter in stress mode 3 shown in FIG. 17C, in accordance with some embodiments.

In FIG. 17C, Stress Mode 3 (DC PMOS stress), the transistors 1510, 1518 and 1520 are turned off. As shown in Table 3, EN=1, EN1=1, EN2=1 and V1=1. The drain current from V2 and the NMOS current from V1 are measured. Detailed operation and measurement of AC stress mode is described below in FIG. 20. [INVENTOR: YOUR COMMENTS IS NOT CLEAR HERE.]

Figure 18:
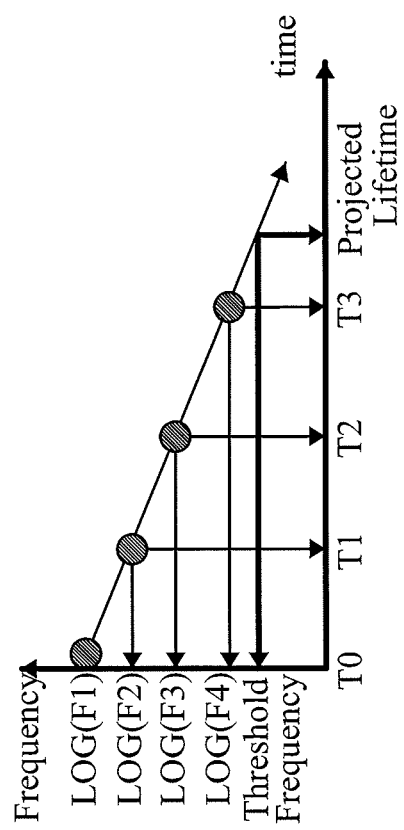
FIG. 18 is a graph illustrating a linear relationship between the logarithm of AC frequency and the stress time of NOR gate in stress mode 1 shown in FIG. 17A, in accordance with some embodiments.

FIG. 18 is a graph illustrating a linear relationship between the logarithm of the AC frequency and the stress time of the NOR gate in stress mode 1 shown in FIG. 17A, in accordance with some embodiments. During mode 1, the AC stress is applied and the AC frequency is measured. The AC stress mode setting is: Vdd=1, GND=0, EN1=1, EN2=0 and EN=0. The transistors 1510 and 1512 are turned off under these setting.

Under the AC stress mode setting, after being powered, the initial frequency $F_1$ of the ring oscillator 1500 shown in FIG. 15B is measured, e.g., by measuring signal frequency at node 1508. Similar to the method shown in FIG. 5, a linear relationship is extracted from these data points $(T_i, \log(F_{i+1}))$ to predict a projected lifetime of the transistors at a threshold frequency. This measurement under the AC stress mode can obtain information regarding frequency degradation resulting from PMOS BTI, NMOS BTI and NMOS HCI AC stress.

Figure 19:
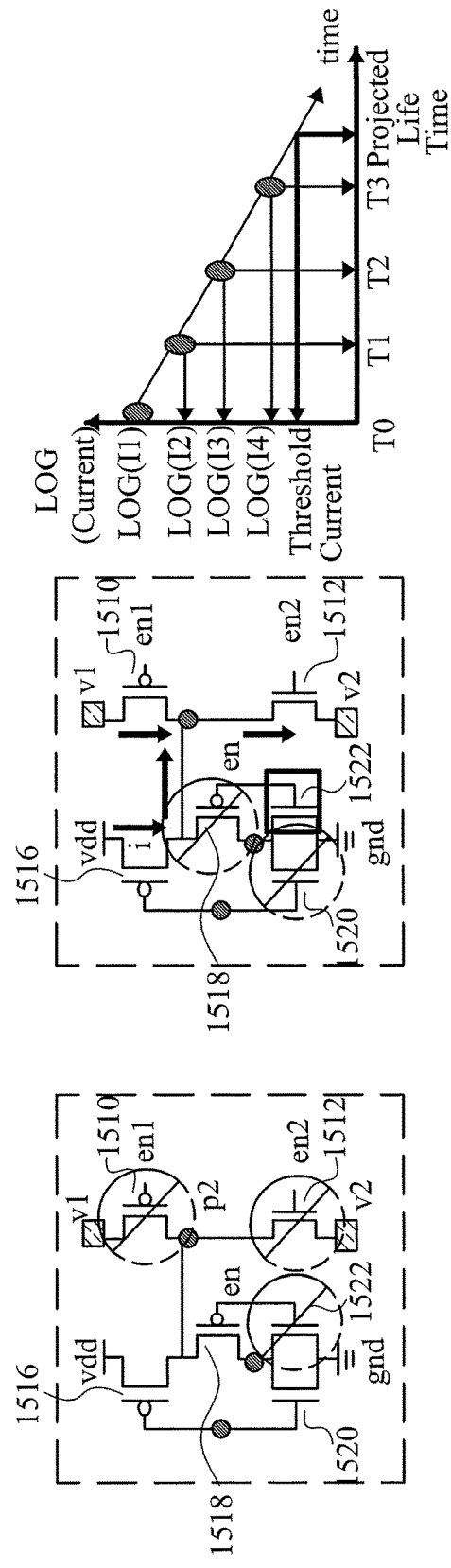
FIG. 19A is a schematic diagrams illustrating the stress mode setting of stress mode 2 shown in FIG. 17B, in accordance with some embodiments.
FIG. 19B is a schematic diagrams illustrating the measurement mode setting of stress mode 2 shown in FIG. 17B, in accordance with some embodiments.
FIG. 19C is a graph illustrating a linear relationship between the logarithm of DC current and the stress time of an inverter in stress mode 2 shown in FIG. 17B, in accordance with some embodiments.

FIG. 19A-19C are schematic diagrams illustrating the operation of stress mode 2 and the measurement of DC parameters. During mode 2, after being powered on under the DC measurement mode setting (FIG. 19B), the initial current $I_1$ in the PMOS transistor 1516 flowing from the drain to the source is measured. Then the AC stress is applied for a first period of time $T_1$, the transistors 1516, 1518 and 1520 are degraded or aged under high temperature and high voltage. Then the DC currents $I_2$ in the PMOS transistor 1516 flowing from the drain to the source is measured again. The system alternates between the AC stress mode setting (FIG. 19A) and the DC measurement mode setting (FIG. 19B) to obtain more pairs of corresponding stress time period values and current values, $(T_2, I_3)$, $(T_3, I_4)$, etc. The AC stress mode setting (FIG. 19A) is Vdd=1, GND=0, EN1=1, EN=0 and EN2=0. The DC measurement mode setting (FIG. 19B) is Vdd=1, GND=0, EN=1, EN1=0, EN2=1, V1=0, and V2=−1.

FIG. 19C is a graph illustrating a linear relationship between the logarithm of the DC current and the stress time of an inverter in stress mode 2 shown in FIG. 17B, in accordance with some embodiments. Similar to the method shown in FIG. 5, a linear relationship is extracted from these data points $(T_i, \log(I_{i+1}))$ to predict a projected lifetime of the transistors at a threshold current. This measurement under mode 2 can obtain information regarding current degradation resulting from PMOS BTI under AC stress.

FIG. 20A-20C are schematic diagrams illustrating the operation of stress mode 3 (DC HCI stress) and the measurement of DC parameters. During stress mode 3, the DC stress is applied and the DC currents are measured. Under stress mode 3, after being powered on under the DC measurement mode setting (FIG. 20B), the initial current $I_1$ in the PMOS transistor 1516 flowing from the drain to the source is measured. Then the DC stress is applied for a first period of time $T_1$, the transistors 1516 and 1522 are degraded or aged under high temperature and high voltage. Then the DC currents $I_2$ in the PMOS transistor 1516 flowing from drain to source is measured again.

The system alternates between the AC stress mode setting and the DC measurement mode setting to obtain more pairs of stress time period values and corresponding current values, $(T_2, I_3)$, $(T_3, I_4)$, etc. The DC stress mode setting (FIG. 20A) is: Vdd=1, GND=0, EN=1, EN1=1, EN2=0, V1=0 and V2=0. The DC measurement mode setting (FIG. 20B) is: Vdd=1, GND=0, EN1=0, EN2=1, V1=0, and V2=−1.

FIG. 20C is a graph illustrating a linear relationship between the logarithm of the DC current and the stress time of an inverter in stress mode 3 shown in FIG. 17C, in accordance with some embodiments. Similar to the method shown in FIG. 5, a linear relationship is extracted from these data points $(T_i, \log(I_{i+1}))$ to predict a projected lifetime of the transistors at a threshold current. This measurement under mode 3 can obtain information regarding current degradation resulting from PMOS BTI under DC stress.

Figure 21:
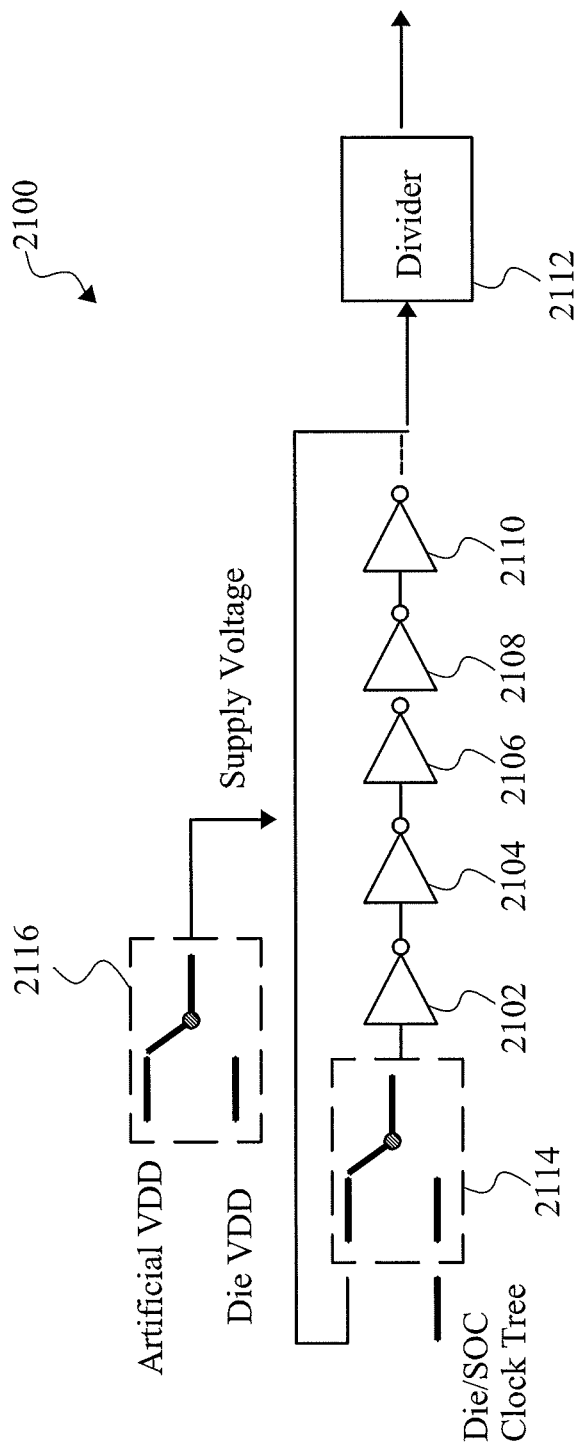
FIG. 21 is a schematic diagram illustrating a delay line containing five stages of inverters, in accordance with some embodiments.

FIG. 21 is a schematic diagram of a delay line 2100, in accordance with some embodiments. A delay line is a device producing a specific desired delay in the transmission of a signal. As illustrated in FIG. 21 according to some embodiments, the delay line 2100 has a similar structure as the ring oscillators as illustrated in FIGS. 2A-B, 9A-B, and 15A-B above. Delay lines perform different functions such as producing a specific desired delay in the transmission of a signal. Delay lines can also serve as sensors of aging and degradation because the delay changes as a result of degradation. According to some embodiments the delay line 2100 has an odd number of inverters 2102, 2104, 2106, 2108 and 2110. According to some other embodiments the delay line 2100 has an odd number of NAND gates or NOR gates. The delay line 2100 has a first switch 2114 which switches between a clock tree of the chip and the signal from the last inverter 2110. The clock tree is also known as clock distribution network. The clock tree distributes the clock signal(s) from a common point to all the elements that need the clock signal. The delay line also has a second switch 2116 which switches between artificial test voltages (e.g. for testing) and the actual voltage for the die. According to some embodiments, delay lines are implemented as sensors, such as temperature sensors, to monitor the aging or degradation of chips. Instead of measuring frequencies of ring oscillators to measure the aging or degradation of chip, delay is measured to indicate the aging or degradation of chips or dies. Voltage is switched between artificial test voltages for testing and actual chip voltage for normal operation by switch 2116. A clock signal is compared with the delay in the delay line by the switch 2114.

Figure 22:
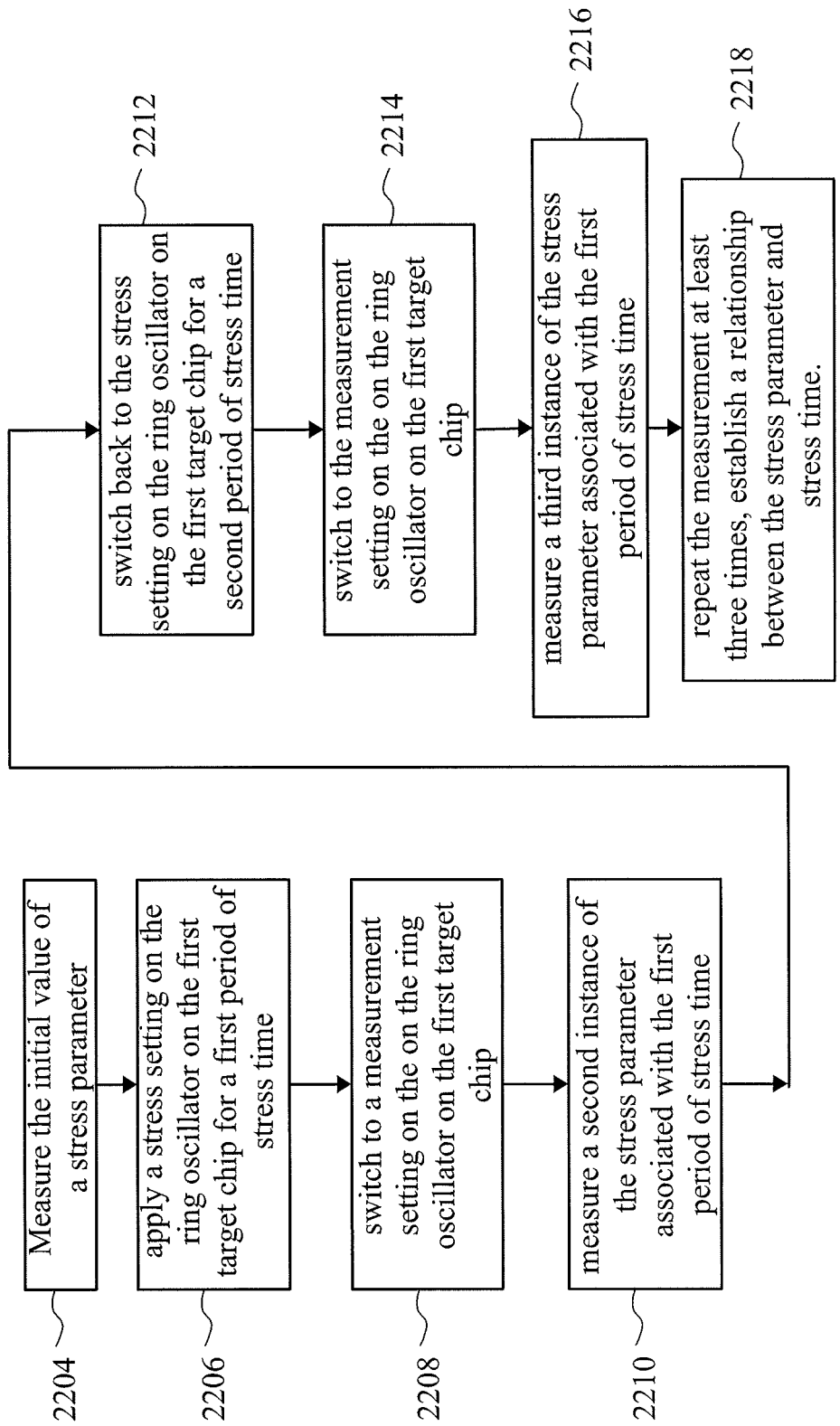
FIG. 22 is a flow chart illustrating a method for degradation measurement in accordance with some embodiments.

FIG. 22 is a flow chart illustrating method for degradation measurement. According to some embodiments, after selecting a first target chip under management, the system measures the initial value of a stress parameter, then the system applies a stress mode setting on the ring oscillator on the selected first target chip for a period of stress time. As discussed above, the stress mode settings include: AC stress, DC NMOS HCI stress, DC PMOS HCI stress, DC NMOS HCI stress, DC PMOS BTI stress etc. Different stress mode settings put the chip under the test for different types of stresses. After the stress testing, the system switches to a measurement mode setting to measure a second instance of stress parameters associated with the period of stress time. Under the measurement mode setting, stress parameters such as AC frequency, drain saturation current, and linear drain current can be measured. Then the system switches back to the stress mode setting again for a second iteration of stress testing. After the second stress testing, the system switches back to measurement mode setting and measure a third instance of the stress parameters. The testing and measurement is repeated at least three times to obtain sufficient data points to establish a relationship between the stress time and the stress parameter. According to some embodiments, the relationship is linear in a log-log plot. The relationship between the stress time and stress parameter is used to predict the lifetime of the chips under a stress condition, which indicates how long a chip can last under certain stress condition.

According to some embodiments, an IC degradation management sensor includes an odd number of first logic gates connected in a ring oscillator configuration, each first logic gate having an input and an output. Each first logic gate further includes a first PMOS transistor, a first NMOS transistor and a second logic gate having an input and an output. The input of the second logic gate is the input of the first logic gate, and the drains of the first PMOS transistor and the first NMOS transistor are connected to the output of the second logic gate, and the output of the second logic gate is the output of the first logic gate.

According to some embodiments, a system for degradation management includes a management unit including a processor, a plurality of dies connected to the management unit, each die including a sensor configured to measure at least one electrical characteristic of at least one node in the sensor, a plurality of signal lines connecting each of the plurality of dies with the management unit, wherein each signal line is shared among the plurality of dies to communicate the at least one electrical characteristic to the management unit and a plurality of control lines connecting the management unit with the plurality of dies for communicating.

According to some embodiments, the sensors in the system for degradation management are ring oscillators. According to some embodiments, the ring oscillator includes an odd number of inverters. The inverter includes a first PMOS transistor, a second PMOS transistor, a first NMOS transistor and a second NMOS transistor. The gate of the second PMOS transistor is connected to the gate of the second NMOS transistor, and the node serves as the input of the inverter. The drain of the first PMOS transistor is connected to the source of the first NMOS transistor, and is further connected to the drain of the second PMOS transistor and the source of the second NMOS transistor, and the node serves as the output of the inverter. The source of the second PMOS transistor is connected to a Vdd, and the drain of the second NMOS transistor is connected to a ground. The source of the first PMOS transistor is a first monitor node and the drain of the first NMOS transistor is a second monitor node. The gate of the first PMOS transistor is a first enable node, and the gate of the first NMOS transistor is a second enable node.

According to some embodiments, the ring oscillator includes an odd number of NAND gates. The NAND gate includes a first PMOS transistor, a second PMOS transistor, a third PMOS transistor, a first NMOS transistor, a second NMOS transistor and a third NMOS transistor. The gate of the second PMOS transistor is connected to the gate of the second NMOS transistor, and the node serves as the input of the NAND gate. The gate of the third PMOS transistor is connected to the gate of the third NMOS transistor. The source of the second PMOS transistor and the source of the third PMOS transistor are connected to Vdd. The drain of the second PMOS transistor and the drain of the third PMOS transistor are connected to the source of the third NMOS transistor. The drain of the third NMOS transistor is connected to the source of the second NMOS transistor, and is further connected to the drain of the first PMOS transistor and the source of the first NMOS transistor. The drain of the second NMOS transistor is connected to ground. The source of the first PMOS transistor is a first monitor node, and the drain of the first NMOS transistor is a second monitor node. The gate of the first PMOS is a first enable node, the gate of the first NMOS transistor is a second enable node, and the gates of third PMOS transistor and the third NMOS transistor are connected together as a third enable node.

According to some embodiments, the ring oscillator includes an odd number NOR gates. The NOR gate includes a first PMOS transistor, a second PMOS transistor, a third PMOS transistor, a first NMOS transistor, a second NMOS transistor and a third NMOS transistor. The source of the third PMOS transistor is connected to Vdd. The gate of the third PMOS transistor is connected to the gate of the third NMOS transistor, and the node serves as the input of the NOR gate. The drain of the third PMOS transistor is connected to the source of the second PMOS transistor, and is further connected to the drain of the first PMOS transistor and the source of the first NMOS transistor, and the node serves as the output of the NOR gate. The gate of the second PMOS transistor is connected to the gate of the second NMOS transistor, and the node serves as a third enable node. The drain of the second PMOS transistor is connected to the source of the second NMOS transistor and the source of the third NMOS transistor. The drain of the second NMOS transistor and the drain of the third NMOS transistor are connected to ground. The source of the first PMOS is a first monitor node, the gate of the first PMOS is a second enable node, the gate of the first NMOS transistor is a first enable node, and the drain of the first NMOS transistor is a second monitor node.

According to other embodiments, a method for degradation management includes the steps of measuring a first instance of a stress parameter at a selected one of a plurality of dies, applying a stress mode setting to an IC degradation management sensor of the selected die for a first period of stress time, switching to a measurement mode setting on the IC degradation management sensor on the selected die after the first period of stress time, measuring a second instance of the stress parameter after the first period of stress time generating a predicted lifetime value for the selected die.

According to other embodiments, a method for degradation management further includes switching back to the stress mode setting on the IC degradation management sensor on the selected die for a second period of stress time, switching to the measurement mode setting on the on the IC degradation management sensor on the selected die, measuring a third instance of the stress parameter associated with the second period of stress time. According to some embodiments, the method further includes determining a relationship between the stress parameter and the stress time for the selected die, the predicted lifetime value is generated based on the determined relationship. According to some embodiments, the method further includes establishing a relationship between the stress parameter and the stress time for each of the plurality of selected dies. According to some embodiments, the method further includes predicting an expected lifetime for a stress parameter under the stress mode setting for each of the plurality of selected die. According to some embodiments, the method further includes powering off a die when the die reaches predicted lifetime.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for degradation management, comprising:
   a management unit including a processor;
   a plurality of dies electrically connected to the management unit, each die including a sensor configured to measure at least one electrical characteristic of at least one node in the sensor;
   a plurality of signal lines electrically connecting each of the plurality of dies with the management unit, wherein each signal line is shared among the plurality of dies to communicate the at least one electrical characteristic to the management unit; and
   a plurality of control lines electrically connecting the management unit with the plurality of dies for communicating.

2. The system of claim 1, wherein each of the plurality of sensors is a ring oscillator.

3. The system of claim 2, wherein the ring oscillator further comprises an odd number of inverters.

4. The system of claim 3, wherein each of the inverter further comprises:
   a first PMOS transistor;
   a second PMOS transistor;
   a first NMOS transistor; and
   a second NMOS transistor,
      wherein the gate of the second PMOS transistor is electrically connected to the gate of the second NMOS transistor, and the node serves as the input of the inverter,
      wherein the drain of the first PMOS transistor is electrically connected to the source of the first NMOS transistor, and is further electrically connected to the drain of the second PMOS transistor and the source of the second NMOS transistor, and the node serves as the output of the inverter,
      wherein the source of the second PMOS transistor is electrically connected to a Vdd, and the drain of the second NMOS transistor is electrically connected to a ground,
      wherein the source of the first PMOS transistor is a first monitor node and the drain of the first NMOS transistor is a second monitor node,
      wherein the gate of the first PMOS transistor is a first enable node, and the gate of the first NMOS transistor is a second enable node.

5. The system of claim 2, wherein the ring oscillator further comprises an odd number of NAND gates.

6. The system of claim 5, wherein each of the NAND gates further comprises:
   a first PMOS transistor;
   a second PMOS transistor;
   a third PMOS transistor;
   a first NMOS transistor;
   a second NMOS transistor; and
   a third NMOS transistor,
      wherein the gate of the second PMOS transistor is electrically connected to the gate of the second NMOS transistor, and the node serves as the input of the NAND gate,
      wherein the gate of the third PMOS transistor is electrically connected to the gate of the third NMOS transistor,
      wherein the source of the second PMOS transistor and the source of the third PMOS transistor are electrically connected to Vdd,
      wherein the drain of the second PMOS transistor and the drain of the third PMOS transistor are electrically connected to the source of the third NMOS transistor, wherein the drain of the third NMOS transistor is electrically connected to the source of the second NMOS transistor, and is further electrically connected to the drain of the first PMOS transistor and the source of the first NMOS transistor, wherein the drain of the second NMOS transistor is electrically connected to ground, wherein the source of the first PMOS transistor is a first monitor node, and the drain of the first NMOS transistor is a second monitor node, wherein the gate of the first PMOS is a first enable node, the gate of the first NMOS transistor is a second enable node, and the gates of third PMOS transistor and the third NMOS transistor are electrically connected together as a third enable node.

7. The system of claim 2, wherein the ring oscillator further comprises an odd number of NOR gates.

8. The system of claim 7, wherein each of the NOR gates further comprises:
a first PMOS transistor;
a second PMOS transistor;
a third PMOS transistor;
a first NMOS transistor;
a second NMOS transistor; and
a third NMOS transistor,
wherein the source of the third PMOS transistor is electrically connected to Vdd,
wherein the gate of the third PMOS transistor is electrically connected to the gate of the third NMOS transistor, and the node serves as the input of the NOR gate,
wherein the drain of the third PMOS transistor is electrically connected to the source of the second PMOS transistor, and is further electrically connected to the drain of the first PMOS transistor and the source of the first NMOS transistor, and the node serves as the output of the NOR gate,
wherein the gate of the second PMOS transistor is electrically connected to the gate of the second NMOS transistor, and the node serves as a third enable node,
wherein the drain of the second PMOS transistor is electrically connected to the source of the second NMOS transistor and the source of the third NMOS transistor,
wherein the drain of the second NMOS transistor and the drain of the third NMOS transistor are electrically connected to ground,
wherein the source of the first PMOS is a first monitor node, the gate of the first PMOS is a second enable node, the gate of the first NMOS transistor is a first enable node, and the drain of the first NMOS transistor is a second monitor node.

9. The system of claim 1, further comprising a plurality of redundant chips.

10. The system of claim 1, wherein each of the plurality of chips further comprises a frequency divider.

11. The system of claim 1, wherein each sensor comprises:
an odd number of first logic gates electrically connected in a ring oscillator configuration,
each first logic gate having an input and an output, wherein each first logic gate further comprises:
a first PMOS transistor;
a first NMOS transistor; and
a second logic gate having an input and an output,
wherein the input of the second logic gate is the input of the first logic gate;
wherein the drains of the first PMOS transistor and the first NMOS transistor are electrically connected to the output of the second logic gate, and the output of the second logic gate is the output of the first logic gate.

12. The system of claim 11, wherein the second logic gate is an inverter, wherein each inverter further comprises:
a second PMOS transistor; and
a second NMOS transistor.

13. The system of claim 12, wherein:
the gate of the second PMOS transistor is electrically connected to the gate of the second NMOS transistor, and the node serves as the input of the inverter;
the drain of the first PMOS transistor is electrically connected to the source of the first NMOS transistor, and is further electrically connected to the drain of the second PMOS transistor and the source of the second NMOS transistor, and the node serves as the output of the inverter;
the source of the second PMOS transistor is electrically connected to a Vdd, and the drain of the second NMOS transistor is electrically connected to a ground;
the source of the first PMOS transistor is a first monitor node and the drain of the first NMOS transistor is a second monitor node; and
the gate of the first PMOS transistor is a first enable node, and the gate of the first NMOS transistor is a second enable node.

14. The system of claim 11, wherein the second logic gate is a NAND gate, wherein each NAND gate further comprises:
a second PMOS transistor;
a third PMOS transistor;
a second NMOS transistor; and
a third NMOS transistor.

15. The system of claim 14, wherein:
the gate of the second PMOS transistor is electrically connected to the gate of the second NMOS transistor, and the node serves as the input of the NAND;
the gate of the third PMOS transistor is electrically connected to the gate of the third NMOS transistor;
the source of the second PMOS transistor and the source of the third PMOS transistor are electrically connected to Vdd; and
the drain of the second PMOS transistor and the drain of the third PMOS transistor are electrically connected to the source of the third NMOS transistor.

16. The system of claim 15, wherein:
the drain of the third NMOS transistor is electrically connected to the source of the second NMOS transistor, and is further electrically connected to the drain of the first PMOS transistor and the source of the first NMOS transistor;
the drain of the second NMOS transistor is electrically connected to ground;
the source of the first PMOS transistor is a first monitor node, and the drain of the first NMOS transistor is a second monitor node; and
the gate of the first PMOS transistor is a first enable node, the gate of the first NMOS transistor is a second enable node, and the gates of third PMOS transistor and the third NMOS transistor are electrically connected together as a third enable node.

17. The system of claim 11, wherein the second logic gate is a NOR gate, wherein each NOR gate further comprises:

a second PMOS transistor;
a third PMOS transistor;
a second NMOS transistor; and
a third NMOS transistor.

18. The system of claim 17, wherein:
the source of the third PMOS transistor is electrically connected to Vdd;
the gate of the third PMOS transistor is electrically connected to the gate of the third NMOS transistor, and the node serves as the input of the NOR gate; and
the drain of the third PMOS transistor is electrically connected to the source of the second PMOS transistor, and is further electrically connected to the drain of the first PMOS transistor and the source of the first NMOS transistor, and the node serves as the output of the NOR gate.

19. The system of claim 18, wherein:
the gate of the second PMOS transistor is electrically connected to the gate of the second NMOS transistor, and the node serves as a third enable node;
the drain of the second PMOS transistor is electrically connected to the source of the second NMOS transistor and the source of the third NMOS transistor;
the drain of the second NMOS transistor and the drain of the third NMOS transistor are electrically connected to ground; and
the source of the first PMOS transistor is a first monitor node, the gate of the first PMOS transistor is a second enable node, the gate of the first NMOS transistor is a first enable node, and the drain of the first NMOS transistor is a second monitor node.

* * * * *